United States Patent
Lee et al.

(10) Patent No.: US 12,061,399 B2
(45) Date of Patent: Aug. 13, 2024

(54) ADHESIVE MEMBER AND DISPLAY DEVICE COMPRISING ADHESIVE MEMBER AND METHOD FOR MANUFACTURING

(71) Applicant: SAMSUNG DISPLAY CO., LTD., Yongin-si (KR)

(72) Inventors: Sangduk Lee, Yongin-si (KR); Chan-Jae Park, Gyeonggi-Do (KR); Kikyung Youk, Bucheon-si (KR); Hyun A Lee, Seoul (KR); Daehwan Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 138 days.

(21) Appl. No.: 17/608,077

(22) PCT Filed: Jul. 15, 2020

(86) PCT No.: PCT/KR2020/009319
§ 371 (c)(1),
(2) Date: Nov. 1, 2021

(87) PCT Pub. No.: WO2021/071060
PCT Pub. Date: Apr. 15, 2021

(65) Prior Publication Data
US 2022/0317489 A1  Oct. 6, 2022

(30) Foreign Application Priority Data
Oct. 11, 2019 (KR) .................... 10-2019-0126246

(51) Int. Cl.
G02F 1/1345 (2006.01)
H10K 59/131 (2023.01)
H10K 71/00 (2023.01)

(52) U.S. Cl.
CPC .......... *G02F 1/1345* (2013.01); *H10K 59/131* (2023.02); *H10K 71/00* (2023.02)

(58) Field of Classification Search
CPC ..... G02F 1/1345; H10K 59/131; H10K 71/00
See application file for complete search history.

(56) References Cited

U.S. PATENT DOCUMENTS 9,190,381 B2 11/2015 Kojima
10,023,775 B2 7/2018 Kawamoto et al.
(Continued)

FOREIGN PATENT DOCUMENTS

JP H06326159 11/1994
JP 2001-156203 6/2001
(Continued)

OTHER PUBLICATIONS

Extended European Search Report Dated Sep. 22, 2023 in Corresponding EP Appln No. 20 874 530.7.

*Primary Examiner* — Lucy P Chien
(74) *Attorney, Agent, or Firm* — F. Chau & Associates, LLC

(57) ABSTRACT

A display device includes an electronic component comprising a bump, which includes a first bump portion and a second bump portion that has a surface area less than that of the first bump portion on a plane to surround the first bump portion, a display panel facing the electronic component and including a signal pad that is in contact with the bump, and an adhesive member which is disposed between the display panel and the electronic component and in which an opening overlapping the first bump portion on the plane is defined, wherein the bump is in contact with the signal pad through the opening.

20 Claims, 24 Drawing Sheets

(56) References Cited

U.S. PATENT DOCUMENTS

| | | | |
|---|---|---|---|
| 10,428,253 B2 | 10/2019 | Minegishi et al. | |
| 10,515,881 B2 | 12/2019 | Kim et al. | |
| 2001/0008310 A1* | 7/2001 | Sakuyama | H01L 21/6835 257/737 |
| 2001/0040547 A1* | 11/2001 | Jinno | G09G 3/3688 345/92 |
| 2002/0080318 A1* | 6/2002 | Yamate | G02F 1/13452 349/149 |
| 2007/0045841 A1 | 3/2007 | Cho et al. | |
| 2010/0147578 A1* | 6/2010 | Matsumura | C08F 265/06 156/332 |
| 2019/0096979 A1* | 3/2019 | Jo | H01L 27/124 |
| 2019/0252636 A1 | 8/2019 | Zhang et al. | |

FOREIGN PATENT DOCUMENTS

| | | |
|---|---|---|
| JP | 2012-067302 | 4/2012 |
| JP | 2013-122957 | 6/2013 |
| JP | 6436081 | 12/2018 |
| KR | 1020060017213 | 2/2006 |
| KR | 10-2009-0015357 | 2/2009 |
| KR | 10-2017-0113552 | 10/2017 |
| KR | 10-2018-0070774 | 6/2018 |
| WO | 9841354 | 9/1998 |

\* cited by examiner

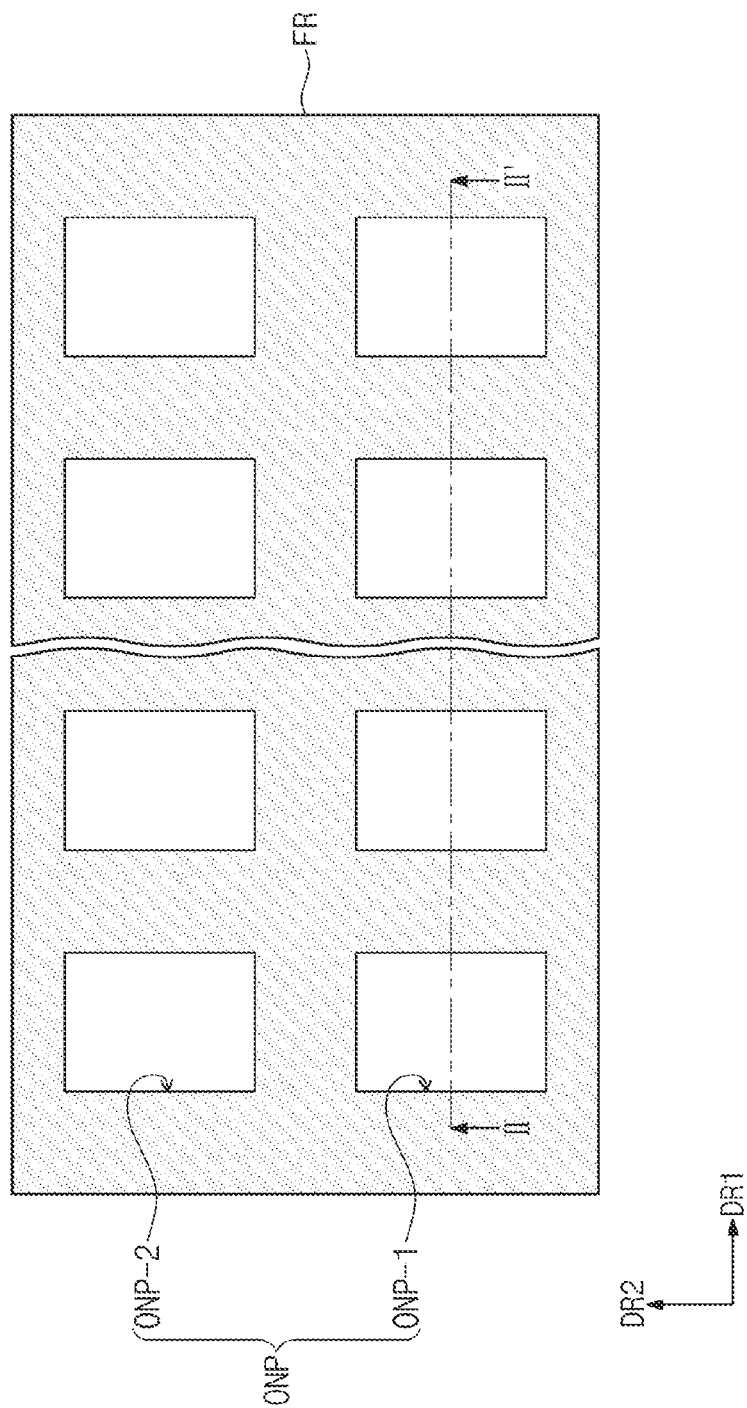

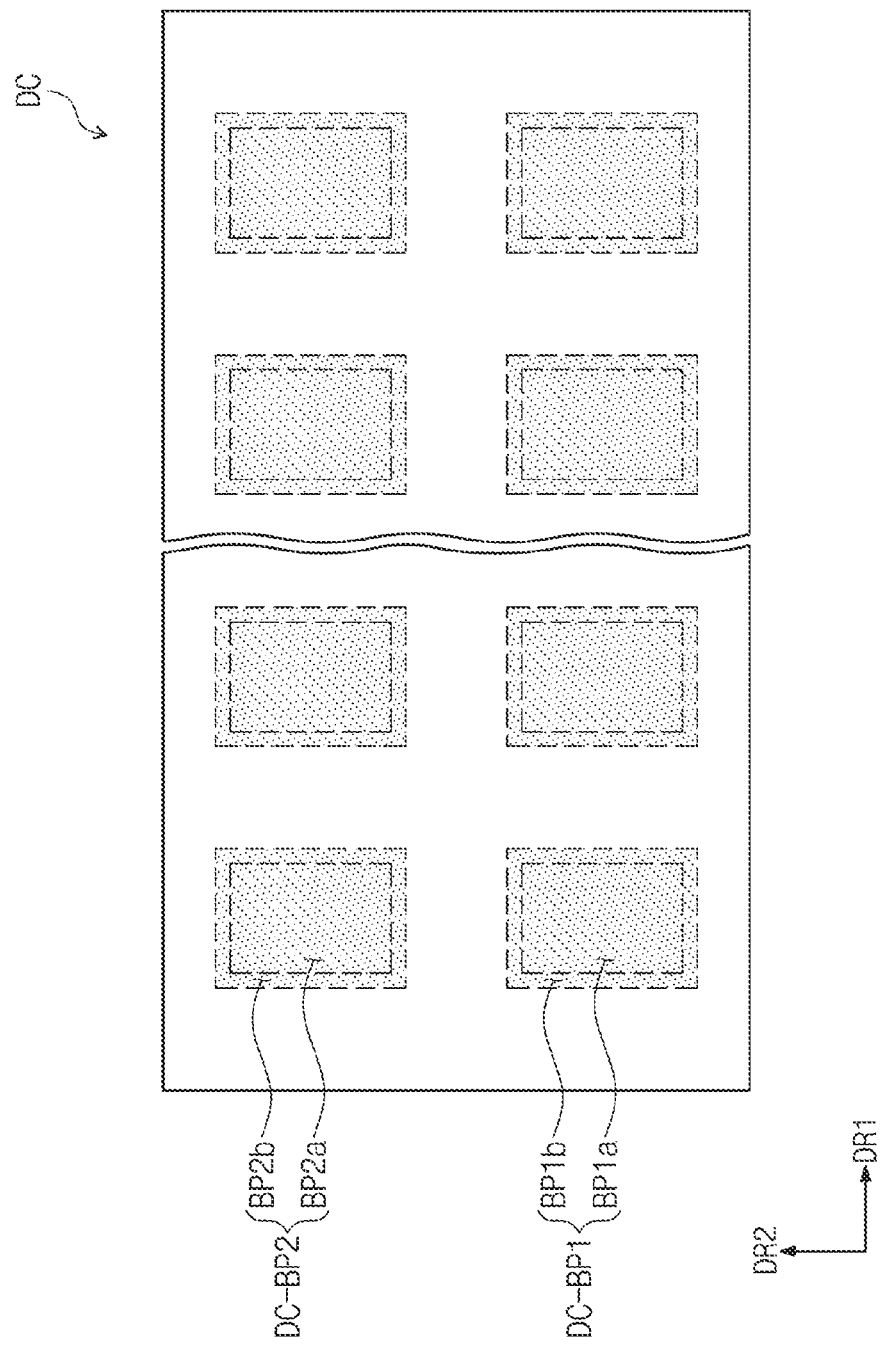

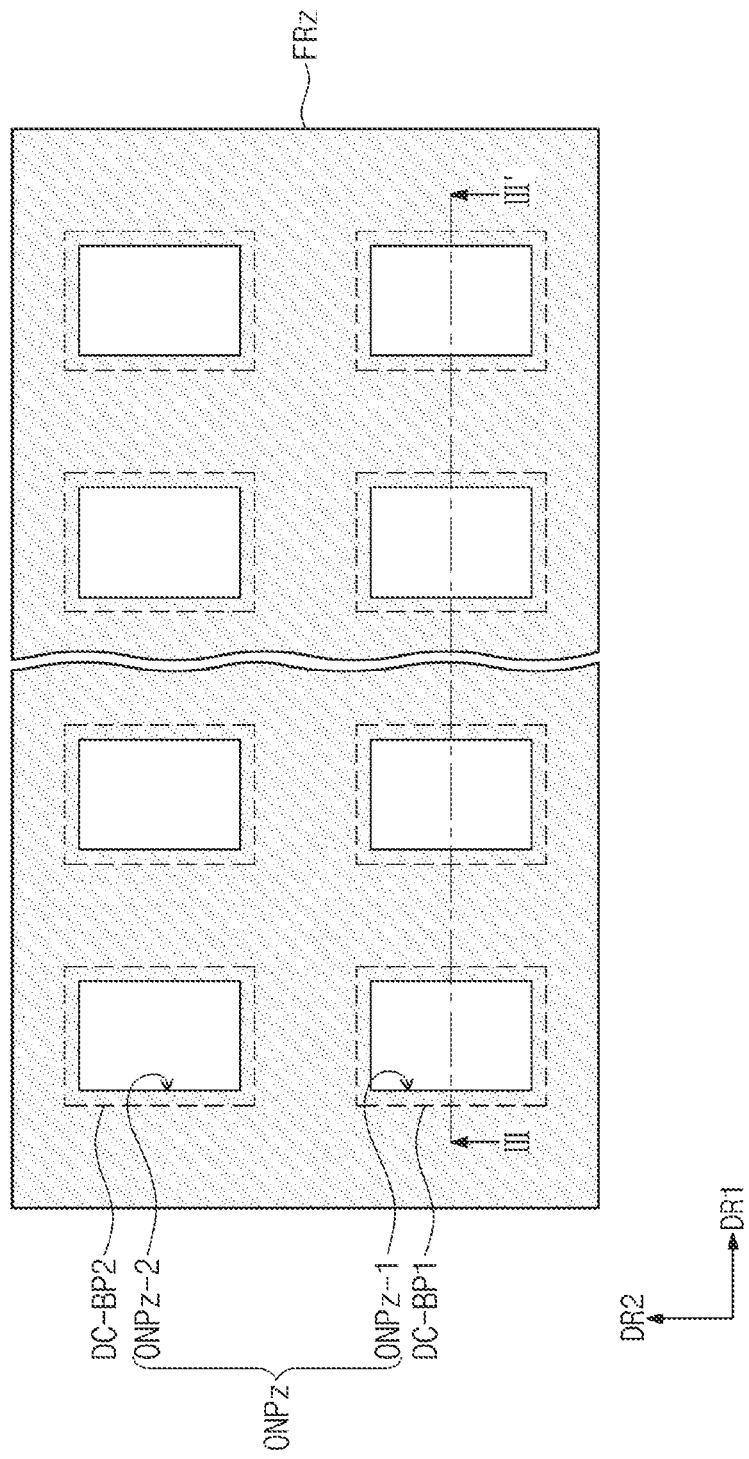

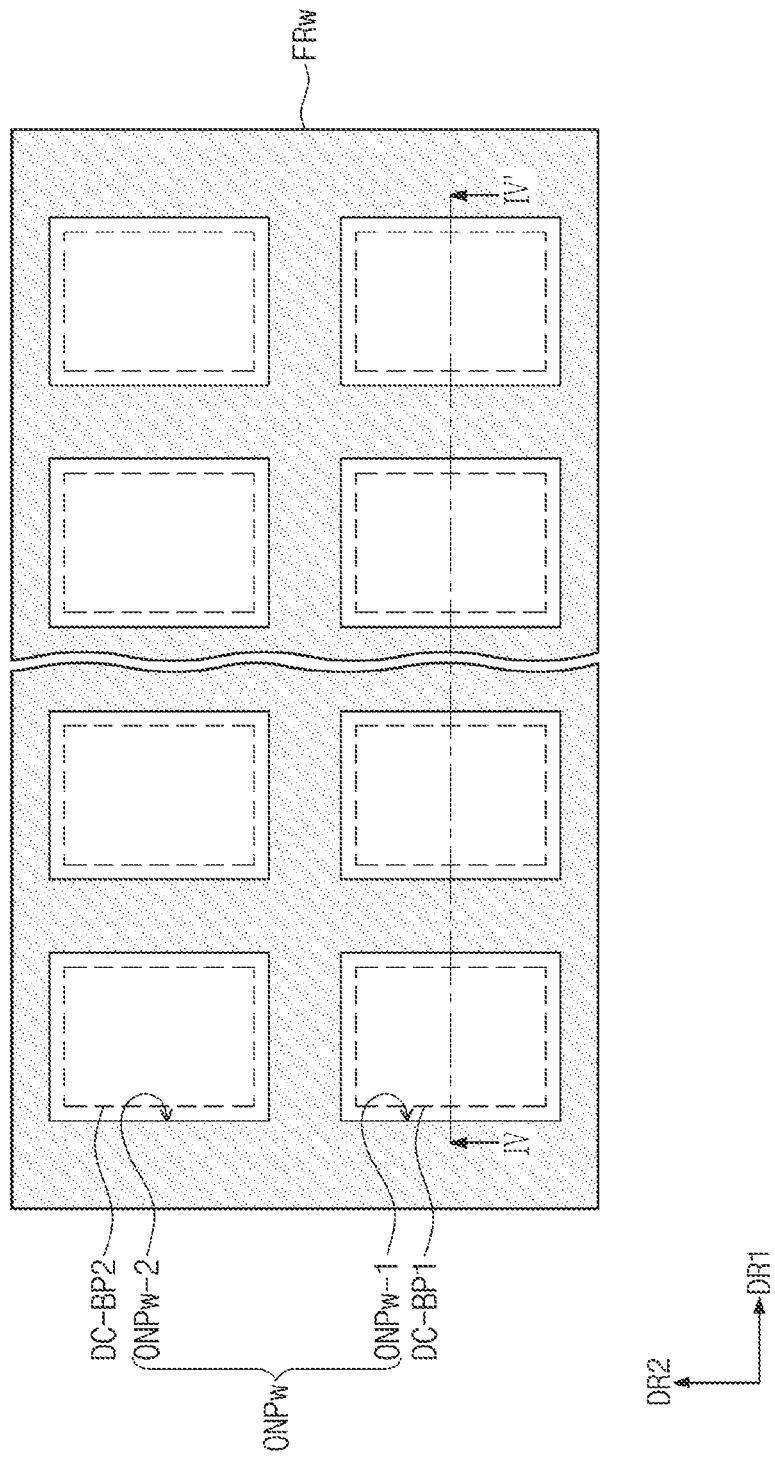

ADHESIVE MEMBER AND DISPLAY DEVICE COMPRISING ADHESIVE MEMBER AND METHOD FOR MANUFACTURING

CROSS-REFERENCE TO RELATED APPLICATIONS

The present application is a National Stage application, filed under 35 U.S.C. § 371, of International Patent Application No. PCT/KR2020/009319, filed on Jul. 15, 2020, which claims priority to Korean Patent Application No. KR 10-2019-0126246, filed on Oct. 11, 2019, the contents of which are incorporated by reference herein in their entirety.

TECHNICAL FIELD

The present invention relates to a display device, and more particularly, to an adhesive member connecting an electronic component to a display panel, a display device including the same, and a method of manufacturing the display device.

DISCUSSION OF RELATED ART

Various display devices used in multimedia equipment such as televisions, mobile phones, tablet computers, navigation devices, and game consoles are being developed.

Such a display device includes a display panel on which an image is displayed. The display panel includes a plurality of gate lines, a plurality of data lines, and a plurality of pixels connected to the plurality of gate lines and the plurality of data lines. The display device may include to an electronic component that provides an electrical signal required for displaying an image to the gate lines or the data lines.

The electronic component may be electrically connected to the display panel by using an anisotropic conductive film or ultrasonography bonding. Among them, in the connection method between the display panel and the electronic component using the ultrasonography bonding, conductivity may increase more compared to the anisotropic conductive film and thus may be simplified in process.

SUMMARY

An object of the present invention is to provide an adhesive member that is capable of improving connection reliability between an electronic component and a display panel, a display device including the same, and a method for manufacturing the display device.

A display device according to an embodiment of the present invention for achieving the above object includes an electronic component including a bump, which includes a first bump portion and a second bump portion that has a surface area less than that of the first bump portion on a plane to surround the first bump portion, a display panel facing the electronic component and including a signal pad that is in contact with the bump, and an adhesive member which is disposed between the display panel and the electronic component and in which an opening overlapping the first bump portion on the plane is defined, wherein the bump is in contact with the signal pad through the opening.

According to an embodiment of the present invention, a planar area of the second bump portion may be less than a planar area of the first bump portion by 5% or more and 50% or less.

According to an embodiment of the present invention, the adhesive member may not be in contact with the first bump portion.

According to an embodiment of the present invention, on the plane, the opening may overlap the bump on the whole.

According to an embodiment of the present invention, the adhesive member may not be in contact between the signal pad and the bump, which face each other.

According to an embodiment of the present invention, the adhesive member may be spaced apart from the second bump portion on the plane.

According to an embodiment of the present invention, an inner space may be defined by the bump, the signal pad, and the adhesive member.

According to an embodiment of the present invention, on the plane, the adhesive member may at least partially overlap between the signal pad and the second bump portion.

According to an embodiment of the present invention, the adhesive member may not be in contact with the first bump portion.

According to an embodiment of the present invention, on the plane, the adhesive member may overlap a planar area of the second bump portion by 30% or more to 70% or less.

According to an embodiment of the present invention, on the plane, the outermost portion of the adhesive member may be provided in a rectangular shape.

According to an embodiment of the present invention, the adhesive member may have transmittance of 30% to 80% in a wavelength region of visible light.

According to an embodiment of the present invention, the opening may include a plurality of sub-openings spaced apart from each other on the plane and arranged in one direction.

According to an embodiment of the present invention, the adhesive member may have non-conductivity and include a thermal initiator.

According to an embodiment of the present invention, the display panel may include a plurality of signal pads corresponding to the signal pad and arranged in a first direction, the electronic component may include a plurality of bumps which correspond to the bump, are arranged in the first direction, and are in contact with the signal pads, respectively; on the plane, the adhesive member may not overlap the signal pads and the bumps.

A method for manufacturing a display device according to another embodiment of the present invention for achieving the above object includes providing a display panel including a signal pad and an electronic component including a bump, disposing an adhesive member, in which opening is defined, between the display panel and the electronic component, aligning the signal pad and the bump so that the signal pad and the bump face each other with the opening therebetween, applying heat and a pressure to the electronic component so that the bump passing through the opening is in contact with the signal pad, and applying ultrasonic vibration to an interface between the bump and the signal pad.

According to an embodiment of the present invention, on the plane, the bump may overlap the opening by 70% or more.

According to an embodiment of the present invention, the bump may overlap the opening on the whole, and an inner space may be defined by the bump, the signal pad, and the adhesive member.

According to an embodiment of the present invention, a planar area of the adhesive member disposed between the display panel and the electronic component may be less than a planar area of the bump.

In an adhesive member disposed between an electronic component and an electronic panel to connect the electronic component to the electronic panel according to another embodiment of the present invention for achieving the above object, the adhesive member includes a plurality of opening arranged at a predetermined interval in a first direction and respectively overlapping bumps of the electronic component on a plane, and includes a thermal initiator.

According to the embodiment of the present invention, the bump may pass through the opening defined in the adhesive member so as to be in contact with the signal pad. Therefore, when the ultrasonography bonding process is performed between the bump and the signal pad, the change in shape of the adhesive member may be reduced. As the change in shape of the adhesive member is prevented, the phenomenon in which the electronic component is lifted from the display panel may be prevented by the adhesive member.

Therefore, the electrical connection reliability between the electronic component and the display panel may be improved on the whole.

BRIEF DESCRIPTION OF THE DRAWINGS

The above and other features of the present invention will become more apparent by describing in detail embodiments thereof with reference to the accompanying drawings, in which:

FIG. 5b is a cross-sectional view taken along line I-I' of FIG. 5a.

FIG. 7a is a plan view of an adhesive member according to an embodiment of the present invention.

FIG. 7b is a plan view of an electronic component according to an embodiment of the present invention.

FIG. 9a is a plan view of an adhesive member according to another embodiment of the present invention.

FIG. 9b is a cross-sectional view of a display device, taken along line of FIG. 9a.

FIG. 10a is a plan view of an adhesive member according to another embodiment of the present invention.

FIGS. 10b and 10c are cross-sectional views of the display device, taken along line IV-IV' of FIG. 10a.

FIG. 11b is a cross-sectional view of a display device, taken along line V-V' of FIG. 11a.

DETAILED DESCRIPTION OF THE EMBODIMENTS

Figure 1A:
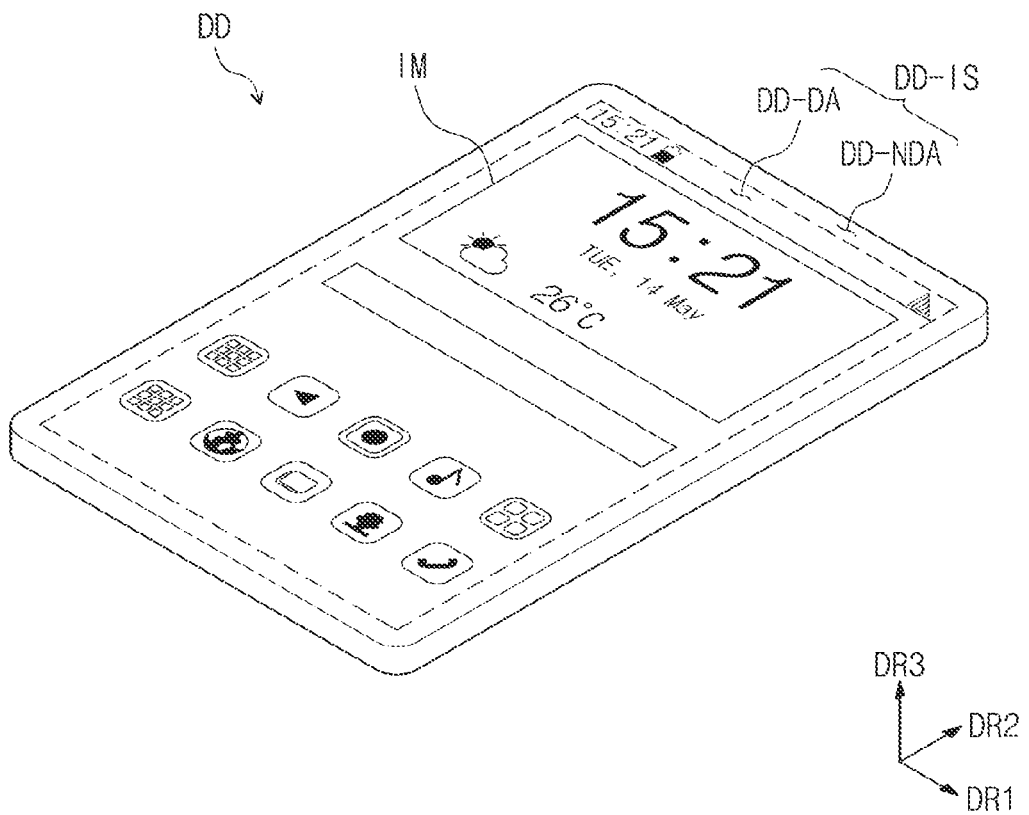
FIG. 1a is a perspective view of a display device according to an embodiment of the present invention.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present invention will be described with reference to the accompanying drawings.

Figure 1B:
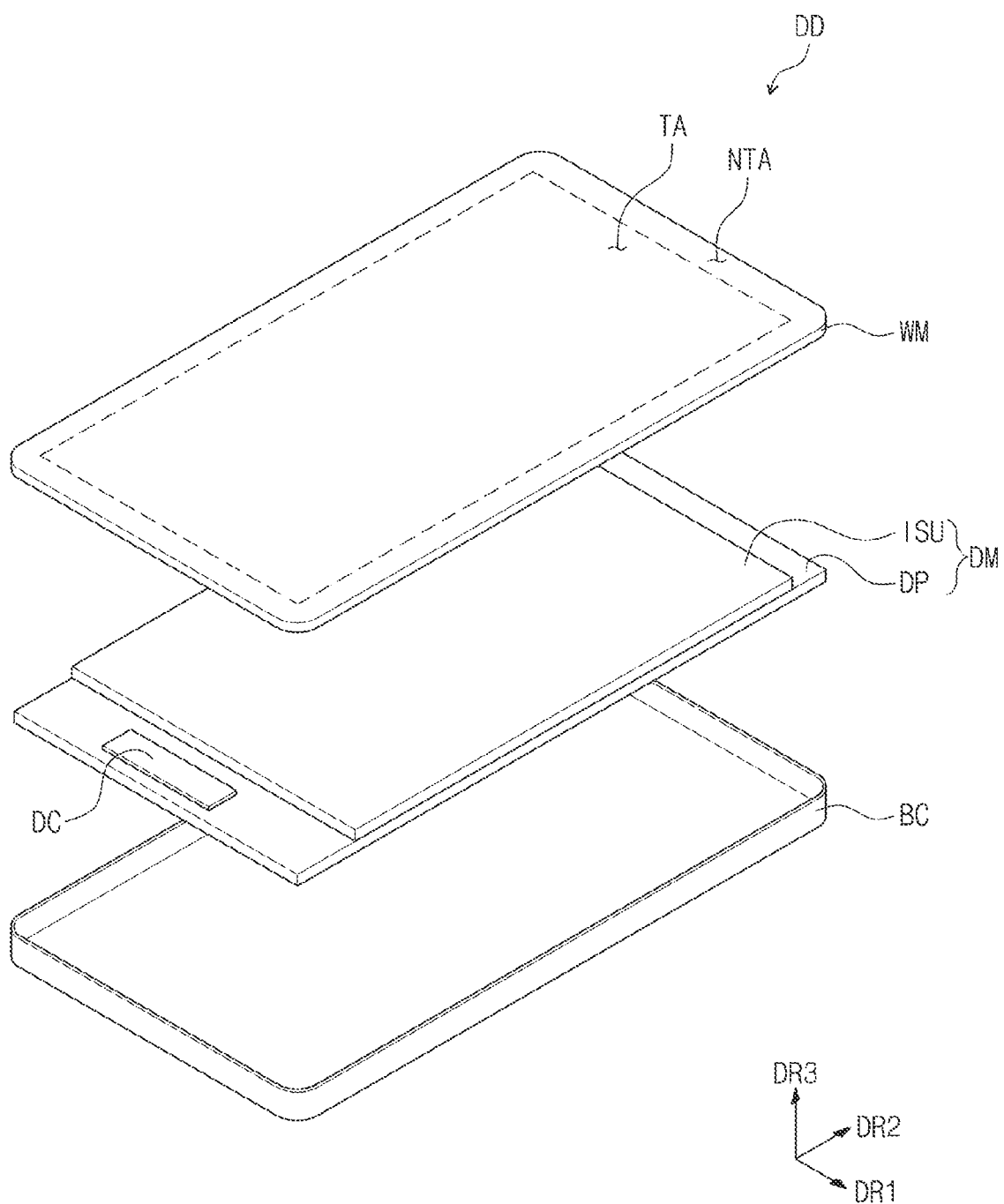
FIG. 1b is an exploded perspective view of the display device according to an embodiment of the present invention.
Figure 2:
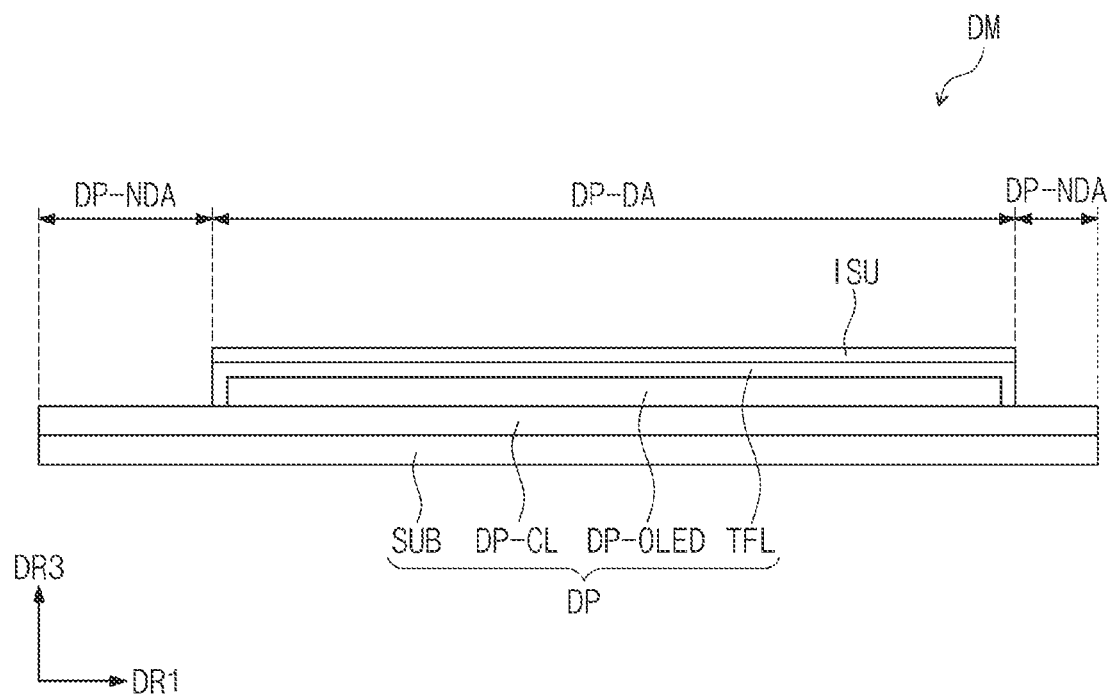
FIG. 2 is a cross-sectional view of a display module according to an embodiment of the present invention.

FIG. 1a is a perspective view of a display device according to an embodiment of the present invention. FIG. 1b is an exploded perspective view of the display device according to an embodiment of the present invention. FIG. 2 is a cross-sectional view of a display module according to an embodiment of the present invention.

In this specification, a display device DD that is capable of being applied to a mobile terminal is exemplarily illustrated. Although not shown, electronic modules, a camera module, a power module, and the like, which are mounted on a main board, may be disposed on a bracket/case together with the display device DD to constitute the mobile terminal. The display apparatus DD according to an embodiment of the present invention may be applied to large-sized electronic apparatuses such as televisions and monitors and small and middle-sized electronic apparatuses such as a tablet PC, navigation units for vehicles, game consoles, and smart watches.

Referring to FIG. 1a, a display device DD may display an image IM through a display surface DD-IS. Icon images as an example of the image IM are illustrated in FIG. 1a. The display surface DD-IS is parallel to a surface defined by a first direction DR1 and a second direction DR2. A normal direction of the display surface DD-IS, i.e., a thickness direction of the display device DD is indicated as a third direction DR3. In this specification, "when viewed on a plane or on the plane" may mean a case when viewed in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be changed into different directions, for example, opposite directions as a relative concept.

Also, the display surface DD-IS includes a display area DD-DA on which an image IM is displayed and a non-display area DD-NDA that is adjacent to the display area DD-DA. The non-display area DD-NDA may be an area on which an image is not displayed. However, the embodiment of the present invention is not limited thereto. The non-display area DD-NDA may be adjacent to one side of the display area DD-DA or be omitted.

Referring to FIG. 1B, the display device DD may include a window WM, a display module DM, an electronic component DC, and an accommodation member BC. The accommodation member BC may accommodate the display module DM and be coupled to the window WM.

The window WM may be disposed above the display module DM and can transmit an image provided from the display module DM to the outside. The window WM includes a transmission area TA and a non-transmission area NTA. The transmission area TA overlaps with the display area DD-DA and may have a shape corresponding to the display area DD-DA. The image IM displayed on the display area DD-DA of the display device DD may be visible through the transmission area TA of the window WM from the outside.

The non-transmission area NTA overlaps with the non-display area DD-NDA and may have a shape corresponding to the non-display area DD-NDA. The non-transmission area NTA may be an area having a light transmittance that is relatively less than that of the transmission area TA. However, the technical idea of the present disclosure is not limited thereto, and the non-transmission area NTA may be omitted.

The window WM may be made of glass, sapphire, or plastic. Also, although the window WM is provided as a single layer, the window WM may include a plurality of layers. The window WM may include a base layer and at least one printed layer overlapping the non-transmission area NTA and disposed on a rear surface of the base layer. The printed layer may have a predetermined color. For example, the printed layer may have a black color or have other colors except for the black color.

The display module DM is disposed between the window WM and the accommodation member BC. The display module DM includes a display panel DP and an input sensing layer ISU. In this specification, the display panel DP and the input sensing layer ISU may be described as an electronic panel.

The display panel DP generates an image and may transmit the generated image to the window WM. According to an embodiment of the present invention, the display panel DP may be an emission type display panel, but is not limited thereto. For example, the display panel DP may be an organic light emitting display panel or a quantum-dot light emitting display panel. A light emitting layer of the organic light emitting display panel may include an organic light emitting material. A light emitting layer of the quantum dot light emitting display panel may include a quantum dot, a quantum rod, and the like.

Hereinafter, a case in which the display panel DP according to the present invention is an organic light emitting display panel will be described. However, the technical idea of the present disclosure is not limited thereto, and various display panels may be applied to the present disclosure according to embodiments.

Referring to FIG. 2, the display panel DP includes a substrate SUB, a circuit element layer DP-CL disposed on the substrate SUB, a display element layer DP-OLED, and an insulating layer TFL.

The display panel DP includes a display area DP-DA and a non-display area DP-NDA. The display area DP-DA of the display panel DP corresponds to the display area DD-DA of FIG. 1a or the transmission area TA of FIG. 1b, and the non-display area DP-NDA corresponds to the non-display area DD-NDA of FIG. 1a or the non-transmission area NTA of FIG. 1b.

The substrate SUB may include at least one plastic film. The substrate SUB may include a plastic substrate, a glass substrate, a metal substrate, or an organic/inorganic composite substrate as a flexible substrate.

The circuit element layer DP-CL includes at least one intermediate insulating layer and a circuit element. The intermediate insulating layer includes at least one intermediate inorganic film and at least one intermediate organic film. The circuit element includes signal lines, a driving circuit of a pixel, and the like.

The display element layer DP-OLED may include a plurality of organic light emitting diodes. The display element layer DP-OLED may further include an organic layer such as a pixel defining layer. According to another embodiment, when the display panel is provided as a liquid crystal display panel, the display element layer may be provided as a liquid crystal layer.

The insulating layer TFL seals the display element layer DP-OLED. For example, the insulating layer TFL may be a thin film encapsulation layer. The insulating layer TFL protects the display element layer DP-OLED against foreign substances such as moisture, oxygen, and dust particles. However, the embodiment of the present invention is not limited thereto and an encapsulation substrate may be provided instead of the insulating layer TFL. In this case, the encapsulation substrate may be opposite to the substrate SUB, and the circuit element layer DP-CL and the display element layer DP-OLED may be disposed between the encapsulation substrate and the substrate.

The input sensing layer ISU may be disposed between the window WM and the display panel DP. The input sensing layer ISU senses an input applied from the outside. The input applied from the outside may be provided in various manners. For example, the external input includes various types of external inputs such as a portion of user's body, a stylus pen, light, heat, a pressure, or the like. Also, an input through contact with the portion of the human body such as user's hands as well as adjacent or neighboring space touches (for example, hovering) may also be one form of the input.

The input sensing layer ISU may be directly disposed on the display panel DP. In this specification, that "a constituent A is directly disposed on a constituent B" may mean that an adhesive member is not disposed between the constituents A and B. In this embodiment, the input sensing layer ISU may be manufactured together with the display panel DP through a continuous process. However, the technical idea of the present disclosure is not limited thereto and the input sensing layer ISU may be provided as an individual panel and then be coupled to the display panel DP through an adhesive layer. For another example, the input sensing layer ISU may be omitted.

Referring again to FIG. 1B, the electronic component DC may overlap the non-display area DP-NDA and be disposed on the display panel DP. According to the present invention, the electronic component DC may be a driving chip that transfers a driving signal to the display panel DP. For example, the electronic component DC may generate a driving signal that is required for the operation of the display panel DP on the basis of the control signal transmitted from the outside. The electronic component DC may transmit the generated driving signal to the circuit element layer DP-CL of the display panel DP.

According to an embodiment of the present invention, the electronic component DC may be electrically connected to the display panel DP in an ultrasonography bonding manner. For example, a bump included in the electronic component DC and a signal pad included in the display panel DP may be in contact with each other in the ultrasonography bonding manner.

Figure 3:
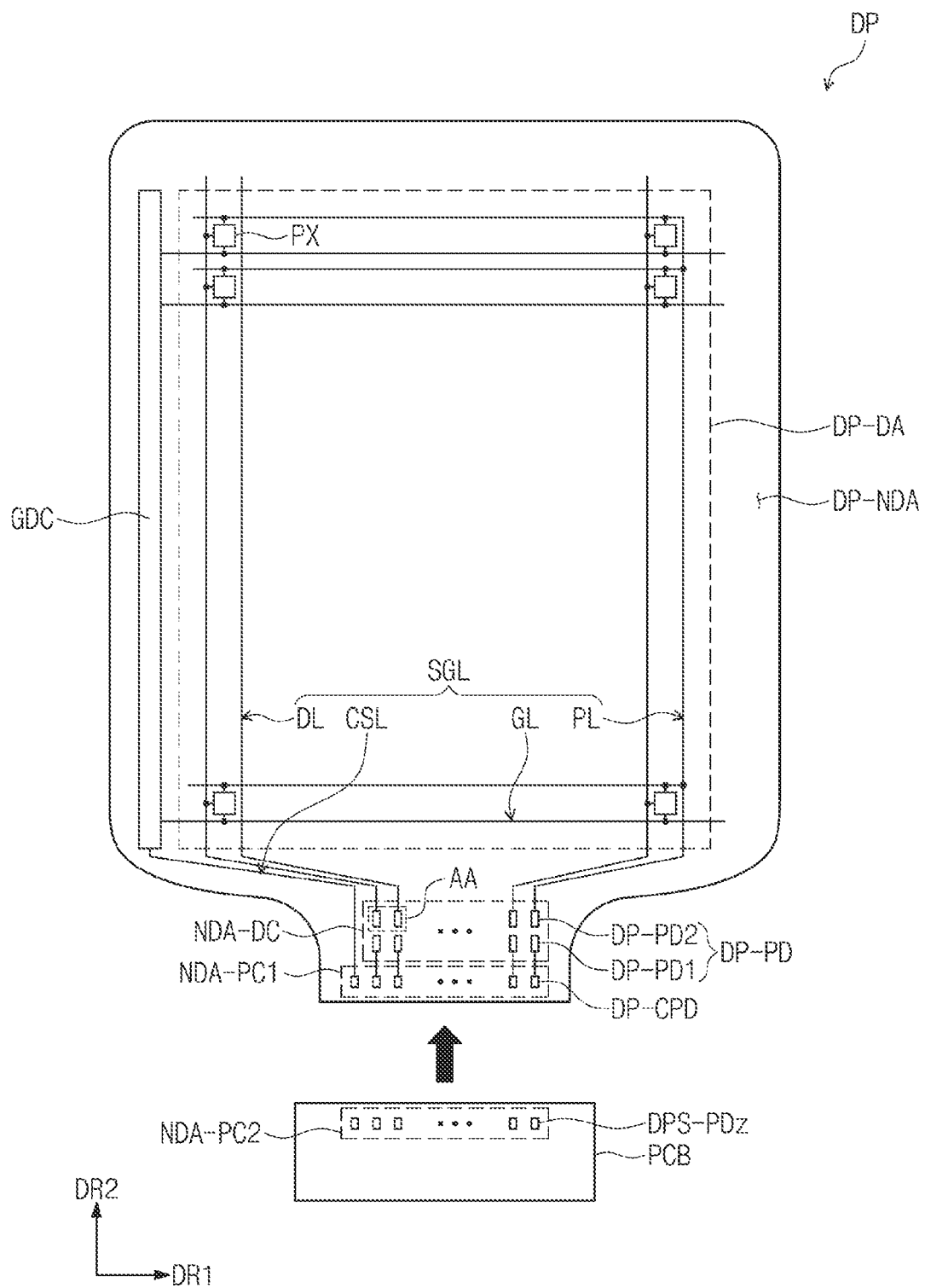
FIG. 3 is a plan view of a display panel according to an embodiment of the present invention.
Figure 4A:
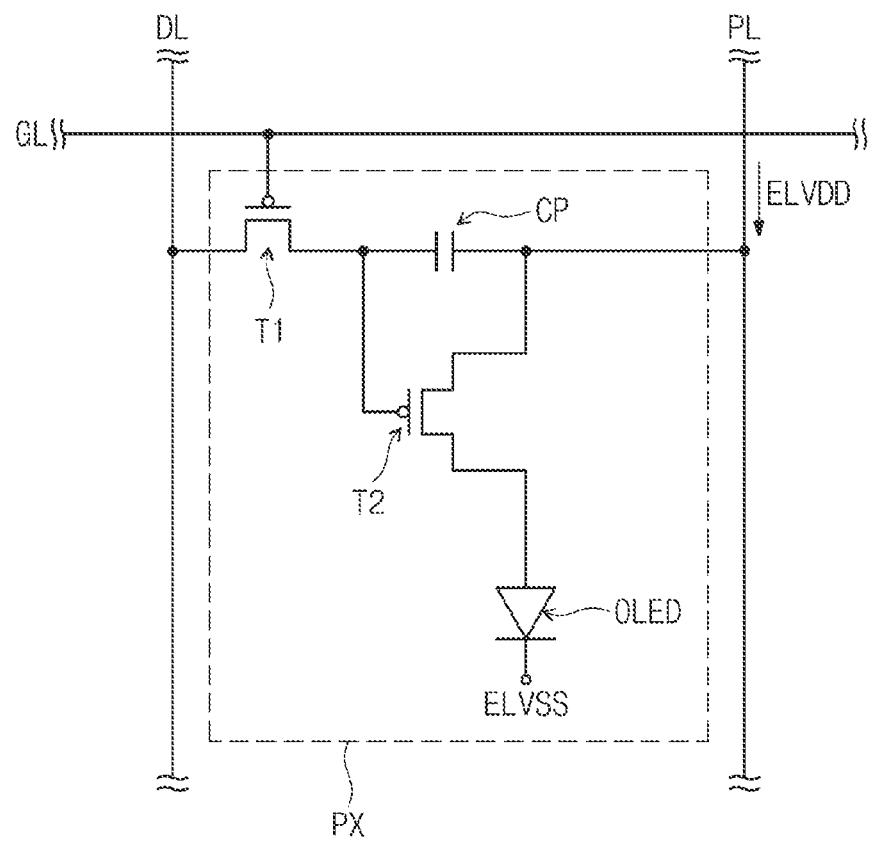
FIG. 4a is an equivalent circuit diagram illustrating an example of a pixel of FIG. 3.
Figure 4B:
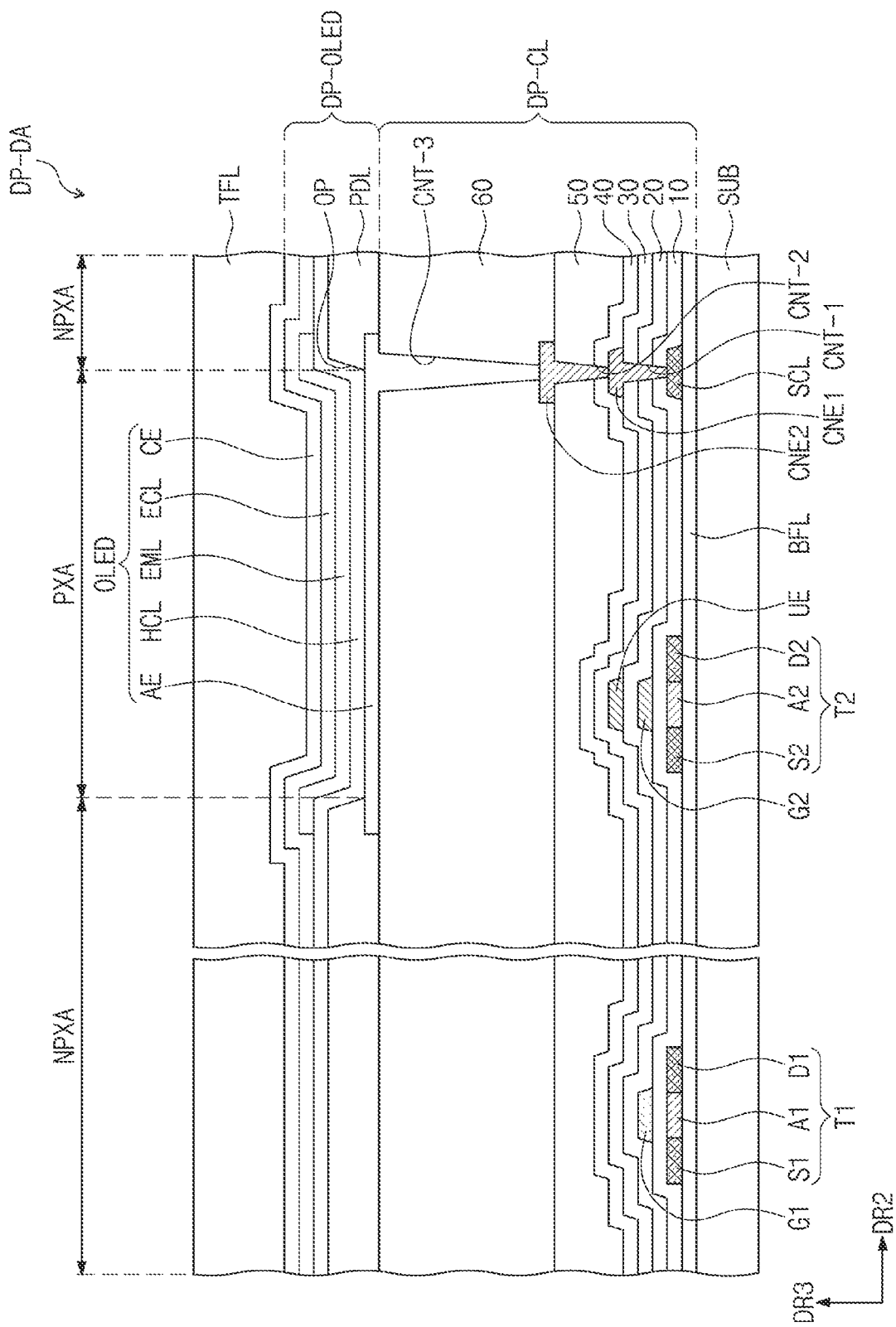
FIG. 4b is an enlarged cross-sectional view of the display panel according to an embodiment of the present invention.
Figure 4C:
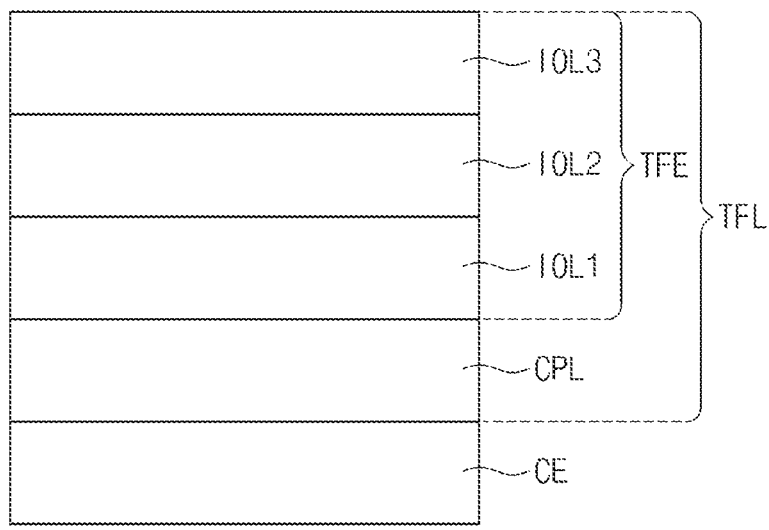
FIG. 4c is a cross-sectional view of an insulating layer according to an embodiment of the present invention.

FIG. 3 is a plan view of the display panel according to an embodiment of the present invention. FIG. 4a is an equivalent circuit diagram illustrating an example of a pixel of FIG. 3. FIG. 4b is an enlarged cross-sectional view of the display panel according to an embodiment of the present invention. FIG. 4c is a cross-sectional view of an insulating layer according to an embodiment of the present invention.

Referring to FIG. 3, the display panel DP may include a driving circuit GDC, a plurality of signal lines SGL, a plurality of signal pads DP-PD, a plurality of connection signal pads DP-CPD, and a plurality of pixels PX (hereinafter, referred to as pixels). The pixels PX are disposed on the display area DP-DA. Each of the pixels PX includes an organic light emitting diode and a pixel driving circuit connected to the organic light emitting diode. The driving circuit GDC, the signal lines SGL, the signal pads DP-PD, the connection signal pads DP-CPD, and the pixel driving circuit may be provided in the circuit element layer DP-CL illustrated in FIG. 2.

The driving circuit GDC sequentially outputs gate signals to the plurality of gate lines GL. The driving circuit GDC may further output other control signals to the pixels PX. The driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL include gate lines GL, data lines DL, a power line PL, and a control signal line CSL. The gate lines GL are respectively connected to corresponding pixels of the pixels PX, and the data lines DL are respectively connected to corresponding pixels PX of the pixels PX. The power line PL is connected to the pixels PX. The control signal line CSL may provide control signals to the driving circuit GDC.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to an end of the line part. The pad part is disposed on the non-display area DP-NDA and overlaps a corresponding signal pad among the signal pads DP-PD.

Hereinafter, in this specification, an area in which the signal pads DP-PD are disposed among the non-display area DP-NDA is defined as a chip area NDA-DC, and an area in which the connection signal pads DP-CPD are disposed, may be defined as a first pad area NDA-PC1.

According to an embodiment of the present invention, the electronic component DC of FIG. 1B may be mounted on the chip area NDA-DC. The signal pads DP-PD are electrically connected to the electronic component DC to transmit the electrical signal received from the electronic component DC to the signal lines SGL.

In detail, the signal pads DP-PD includes first row signal pads DP-PD1 arranged in a first row along the first direction DR1 and second row signal pads DP-PD2 arranged in a second row along the first direction DR1. However, the embodiment of the present invention is not limited thereto and the signal pads DP-PD may be arranged in one row along the first direction DR1.

A portion of the circuit board PCB may be disposed on the first pad area NDA-PC1. The connection signal pads DP-CPD are electrically connected to the circuit board PCB to transmit the electrical signal received from the circuit board PCB to the signal pads DP-PD. The circuit board PCB may be rigid or flexible. For example, when the circuit board PCB is flexible, the circuit board PCB may be provided as a flexible printed circuit board.

The circuit board PCB may include a timing control circuit that controls an operation of the display panel DP. In this specification, the circuit board PCB may be described as the electronic component. The timing control circuit may be mounted in the form of an integrated chip on the circuit board PCB. Also, although not shown, the circuit board PCB may include an input sensing circuit that controls the input sensing layer ISU.

The circuit board PCB may include driving pads DPS-PDz electrically connected to the display panel DP. The driving pads DPS-PDz may be disposed on the second pad area NDA-PC2 defined on the circuit board PCB.

According to an embodiment of the present invention, the circuit board PCB may be electrically connected to the display panel DP through the ultrasonography bonding manner. For example, the driving pads DPS-PDz on the circuit board PCB may be in electrical contact with the connection signal pads DP-CPD included in the display panel DP through the ultrasonography bonding manner.

Referring to FIG. 4a, the display area DP-DA may be defined as an area on which the pixels PX are disposed. Each of the pixels PX includes an organic light emitting diode OLED and a pixel driving circuit connected to the organic light emitting diode OLED.

In detail, the pixel PX may include a first transistor T1, a second transistor T2, a capacitor CP, and an organic light emitting diode OLED. It is sufficient if the pixel driving circuit includes a switching transistor and a driving transistor, but is not limited to the embodiment described with reference to FIG. 4a. As illustrated in FIG. 4a, although each of the first transistor T1 and the second transistor T2 is provided as a P-MOS transistor, the embodiment of the present invention is not limited thereto and may be provided as an N-MOS transistor.

The first transistor T1 is connected to the gate line GL and the data line DL. The organic light emitting diode OLED receives a first power voltage ELVDD and a second power voltage ELVSS, which are provided from the power line PL. The first power voltage ELVDD is provided to a first electrode AE of the organic light emitting diode OLED through the second transistor T2, and the second power voltage ELVSS is provided to a second electrode CE of the organic light emitting diode OLED. The second power voltage ELVSS may be less than the first power voltage ELVDD.

Referring to FIG. 4b, the display panel DP may include a plurality of insulating layers, a semiconductor pattern, a conductive pattern, a signal line, and the like. The insulating layer, the semiconductor layer, and the conductive layer may be formed in a manner such as coating, deposition, or the like. Thereafter, the insulating layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner. In the display panel DP of FIG. 4b, the pixel driving circuit may further include elements when compared to the pixel driving circuit of FIG. 4a including the first transistor T1 and the second transistor T2. The substrate SUB may be a base substrate that supports the circuit element layer DP-CL and the display element layer DP-OLED.

In detail, the substrate SUB may include a synthetic resin film. The synthetic resin layer may include a thermosetting resin. The substrate SUB may have a multi-layered structure. For example, the substrate SUB may have a three-layered structure of a synthetic resin layer, an adhesive layer, and a synthetic resin layer. Particularly, the synthetic resin layer may be a polyimide resin layer, and the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the synthetic resin layer may include a glass substrate, a metal substrate, or an organic/inorganic composite substrate.

At least one inorganic layer may be disposed on a top surface of the substrate SUB. The inorganic layer may include at least one of oxide, titanium oxide, silicon oxide, silicon oxide nitride, zirconium oxide, or hafnium oxide. The inorganic layer may be provided as a multilayer. The multilayered inorganic layer may constitute a barrier layer and/or a buffer layer. In this embodiment, the display panel DP may include the buffer layer BFL.

The buffer layer BFL improves bonding force between the substrate SUB and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, the embodiment of the present invention is not limited thereto and the semiconductor pattern may include amorphous silicon or metal oxide.

FIG. 4b illustrates merely a portion of the semiconductor pattern and the semiconductor pattern may be further disposed on other areas of the pixel PX on the plane. The semiconductor pattern may be arranged in a specific rule over the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. That is to say, a portion of the semiconductor pattern may be an active of the transistor, another portion may be a source or drain of the transistor, and further another portion may be a connection electrode or a connection signal line.

As illustrated in FIG. 4b, a source S1, an active A1, and a drain D1 of a first transistor T1 may be formed from the semiconductor pattern, and a source S2, an active A2, and a drain D2 of the second transistor T2 of the second transistor T2 may be formed from the semiconductor pattern. The sources S1 and S2 and the drains D1 and D2 extend from the actives A1 and A2 in directions opposite to each other. FIG. 4b illustrates a portion of the connection signal line SCL formed from the semiconductor pattern. Although not particularly shown, the connection signal line SCL may be connected to the drain D2 of the second transistor T2 on the plane.

A first insulating layer 10 is disposed on the buffer layer BFL. The first insulating layer 10 commonly overlaps the plurality of pixels PX and covers the semiconductor pattern. The first insulating layer 10 may include an inorganic layer and/or an organic layer and have a single-layered or multi-layered structure. The first insulating layer 10 may include at least one of oxide, titanium oxide, silicon oxide, silicon oxide nitride, zirconium oxide, or hafnium oxide. In this embodiment, the first insulating layer 10 may include a single-layered silicon oxide layer. The insulating layer of the circuit element layer DP-CL, which will be described later, as well as the first insulating layer 10 may be an inorganic layer and/or an organic layer and may have a single-layered or a multi-layered structure. The inorganic layer may include at least one of the above-described materials.

Gates G1 and G2 are disposed on the first insulating layer 10. Each of the gates G1 and G2 may be a portion of the metal pattern. The gates G1 and G2 overlap the actives A1 and A2. In the process of doping the semiconductor pattern, the gates G1 and G2 may serve as masks.

A second insulating layer 20 covering the gates G1 and G2 is disposed on the first insulating layer 10. The second insulating layer 20 commonly overlaps the pixels PX. The second insulating layer 20 may be an inorganic layer and/or an organic layer and have a single-layered or multilayered structure. In this embodiment, the first insulating layer 20 may include a single-layered silicon oxide layer.

An upper electrode UE may be disposed on the second insulating layer 20. The upper electrode UE may overlap the gate G2 of the second transistor T2. The upper electrode UE may be a portion of the metal pattern. A portion of the gate G2 and the upper electrode UE overlapping the portion of the gate G2 may define a capacitor CP (see FIG. 4a).

A third insulating layer 30 covering the upper electrode UE is disposed on the second insulating layer 20. In this embodiment, the third insulating layer 30 may be a single-layered silicon oxide layer. The first connection electrode CNE1 may be disposed on the third insulating layer 30. The first connection electrode CNE1 may be connected to the signal line SCL through a contact hole CNT-1 passing through the first to third insulating layers 10 to 30.

A fourth insulating layer 40 covering the first connection electrode CNE1 is disposed on the third insulating layer 30. The fourth insulating layer 40 may be a single-layered silicon oxide layer. The fifth insulating layer 50 is disposed on a fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 covering the second connection electrode CNE2 is disposed on the fifth insulating layer 50. The sixth insulating layer 60 may be an organic layer. A first electrode AE is disposed on the sixth insulating layer 60. The first electrode AE is connected to the second connection electrode CNE2 through a contact hole CNT-3 passing through the sixth insulating layer 60. An opening OP is defined in the pixel defining layer PDL. An opening OP of the pixel defining layer PDL exposes at least a portion of the first electrode AE.

As illustrated in FIG. 4b, the display area DP-PA may include an emission area PXA and a light blocking area NPXA adjacent to the emission area PXA. The light blocking area NPXA may surround the emission area PXA. In this embodiment, the emission area PXA may be defined to correspond to a portion of an area of the first electrode AE exposed by the opening OP.

A hole control layer HCL may be commonly disposed on the emission area PXA and the light blocking area NPXA. The hole control layer HCL may include a hole transport layer and may further include a hole injection layer. The emission layer EML is disposed on the hole control layer HCL. The emission layer EML may be disposed on an area corresponding to the opening OP. That is, the light emitting layer EML may be formed to be separated from each of the pixels.

An electronic control layer ECL is disposed on the emission layer EML. The electron control layer ECL may include an electron transport layer and may further include an electron injection layer. The hole control layer HCL and the electron control layer ECL may be commonly formed in the plurality of pixels by using an open mask. The second electrode CE is disposed on the electron control layer ECL. The second electrode CE is provided as a single body and commonly disposed on the plurality of pixels PX.

Referring to FIG. 4c, an insulating layer TFL is disposed on the second electrode CE. The insulating layer TFL may include a capping layer CPL and a thin film encapsulation layer TFE. The thin film encapsulation layer TFE may include a first inorganic layer IOL1, an organic layer IOL2, and a second inorganic layer IOL3.

Figure 5A:
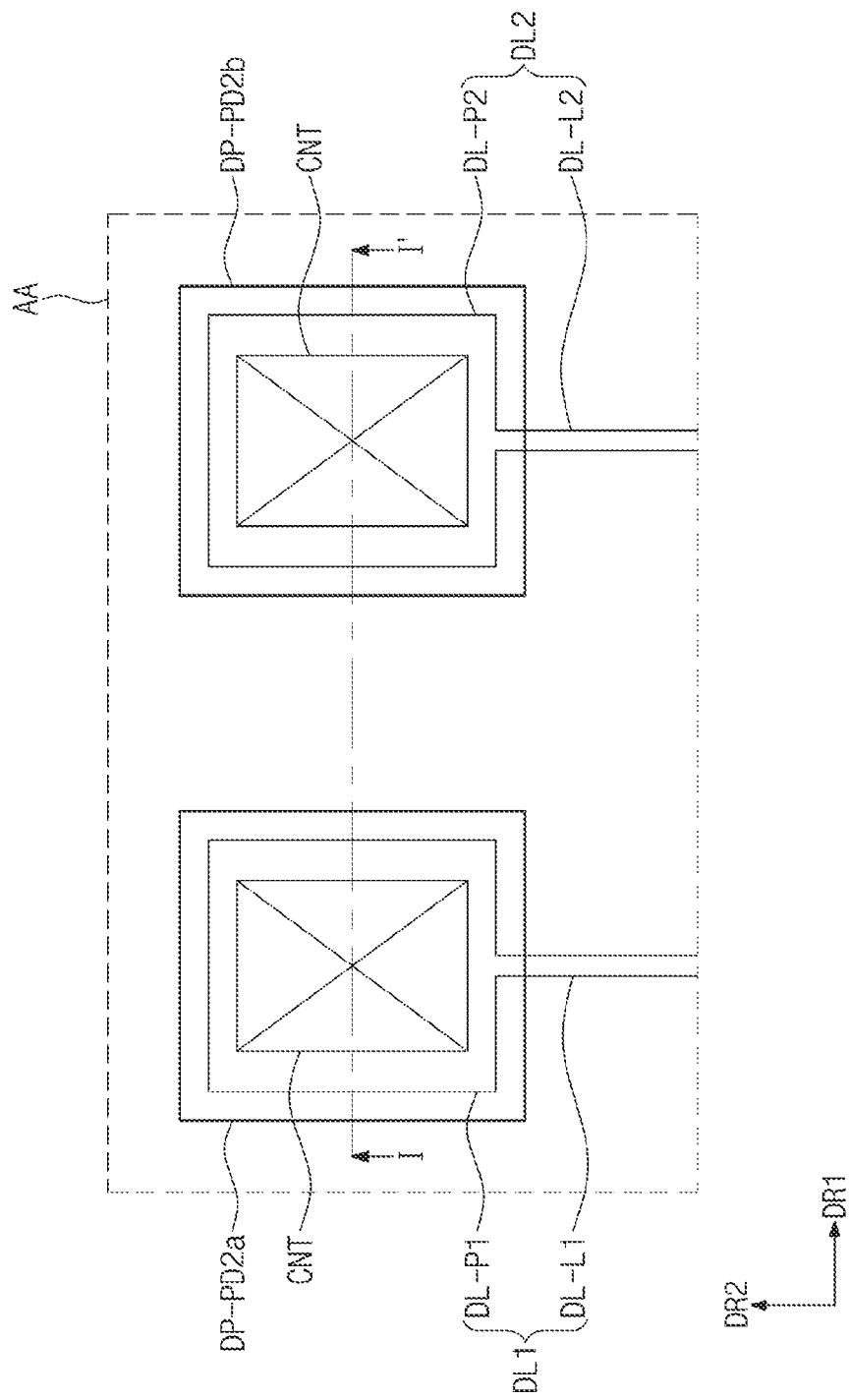
FIG. 5a is an enlarged view of an area AA of FIG. 3 according to an embodiment of the present invention.
Figure 5B:
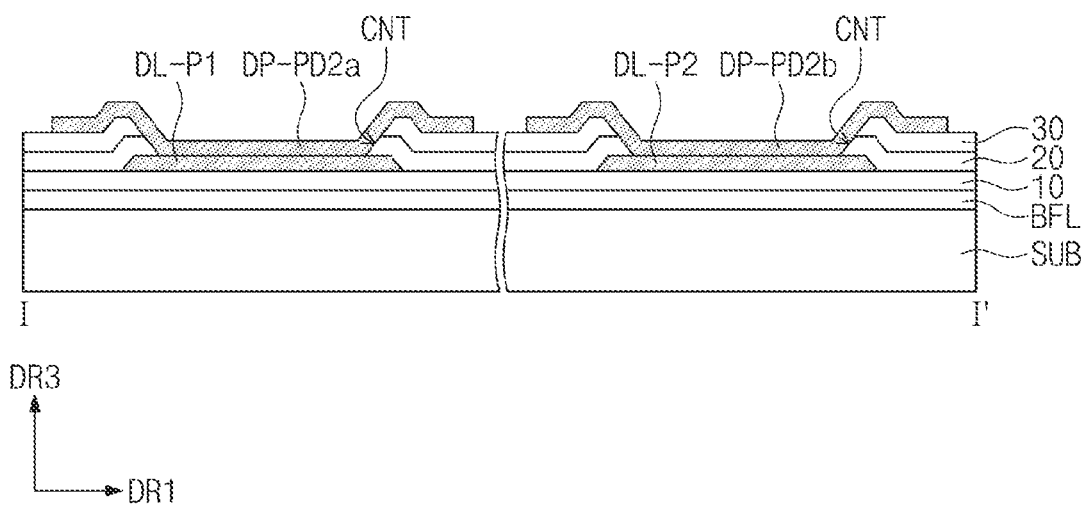

FIG. 5a is an enlarged view of an area AA of FIG. 3 according to an embodiment of the present invention. FIG. 5b is a cross-sectional view taken along line I-I' of FIG. 5a.

Referring to FIG. 5a, two signal pads DP-PD2a and DP-PD2b of the two data lines DL1 and DL2 and the second row signal pads DP-PD2 illustrated in FIG. 3 are illustrated as an example. Although not shown, each of the signal lines SGL illustrated in FIG. 3 may have a structure illustrated in FIG. 5a. Although it has been described that each of the signal lines SGL described in FIG. 3 includes a line part and a pad part, the line part and the pad part may be provided as separate configurations. The pad part may have a surface area greater than that of the line part in the same length along the second direction DR2.

The first data line DL1 includes a first line part DL-L1 and a first pad part DL-P1. The signal pad DP-PD2a may overlap the first pad part DL-P1 and may be in electrical contact with the first pad part DL-P1. The signal pad DP-PD2a may overlap the first pad part DL-P1 on the whole.

The second data line DL2 includes a second line part DL-L2 and a second pad part DL-P2. The signal pad DP-PD2b may overlap the second pad part DL-P2 and may be in electrical contact with the second pad part DL-P2. The signal pad DP-PD2b may overlap the second pad part DL-P2 on the whole.

In detail, referring to FIG. 5b, a lamination structure of the substrate SUB, the buffer layer BFL, and the first to third insulating layers 10 to 30, which are described with reference to FIG. 4b is illustrated. For example, the first line part DL-L1, the first pad part DL-P1, the second line part DL-L2, and the second pad part DL-P2 may be disposed on the first insulating layer 10 and be disposed on the same layer as the gates G1 and G2.

The first pad part DL-P1 may be in electrical contact with the signal pad DP-PD2a through the contact hole CNT passing through the second insulating layer 20 and the third insulating layer 30. The signal pad DP-PD2a may be disposed on the third insulating layer 30.

The second pad part DL-P2 may be in electrical contact with the signal pad DP-PD2b through the contact hole CNT passing through the second insulating layer 20 and the third insulating layer 30. The signal pad DP-PD2b may be disposed on the third insulating layer 30.

According to the present invention, although the contact hole CNT passes through two second and third insulating layers 20 and 30, the contact hole CNT may have a structure that passes through at least one insulating layer. For example, the pad part and the line part of each of the data lines DL1 and DL2 may be disposed on the second insulating layer 20 illustrated in FIG. 4b. In this case, the pad part and the line part of each of the data lines DL1 and DL2 may be formed on the second insulating layer 20 by the same process as the upper electrode UE. That is, an arrangement structure of the pad part and the line part of the signal pad and the data line may be variously modified.

Figure 6:
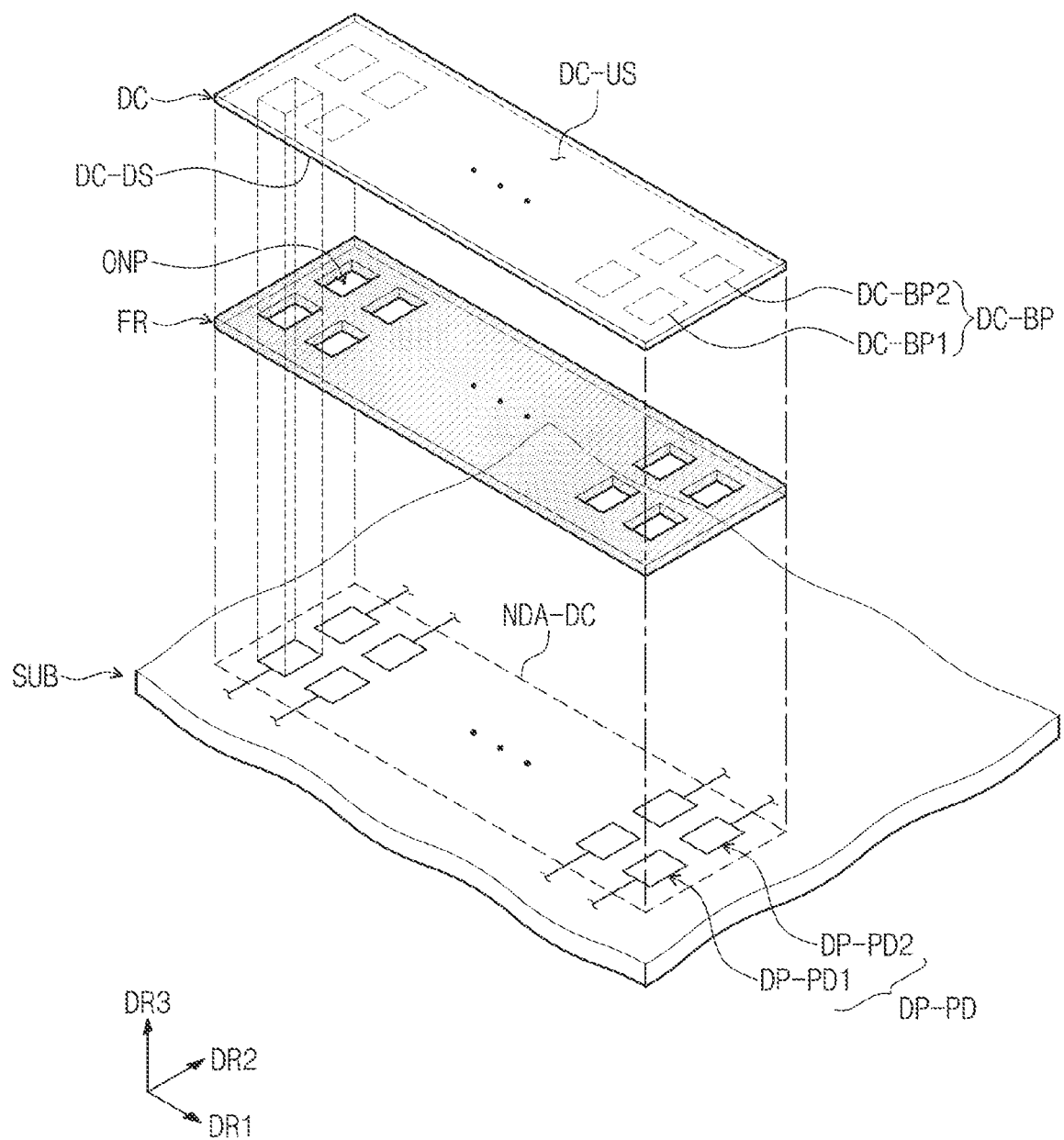
FIG. 6 is an exploded perspective view of a display device according to an embodiment of the present invention.

FIG. 6 is an exploded perspective view of a display device according to an embodiment of the present invention. FIG. 7a is a plan view of an adhesive member according to an embodiment of the present invention. FIG. 7b is a plan view of an electronic component according to an embodiment of the present invention.

Referring to FIG. 6, the electronic component DC includes a top surface DC-US and a bottom surface DC-DS. In this specification, the bottom surface DC-DS of the electronic component DC may be a surface facing the display panel DP. The electronic component DC includes a plurality of bumps DC-BP, which respectively overlap the signal pads DP-PD disposed on the substrate SUB described with reference to FIG. 3.

The bumps DC-BP (hereinafter, referred to as a 'bump') includes first bumps DC-BP1 (hereinafter, referred to as a 'first bump') arranged in a first row along the first direction DR1 and second bumps DC-BP2 (hereinafter, referred to as a 'second bump') arranged in a second row along the first direction DR1. Each of the first bump DC-BP1 and the second bump DC-BP2 may have a shape that is exposed to the outside from the bottom surface of the electronic component DC.

The first bump DC-BP1 is in electrical contact with the first row signal pads DP-PD1 (hereinafter referred to as a "first signal pad") through the ultrasonography bonding manner. The second bump DC-BP2 is in electrical contact with the second row signal pads DP-PD2 (hereinafter, referred to as a "second signal pad") through the ultrasonography bonding manner.

The adhesive member FR may be disposed between the electronic component DC and the substrate SUB of the display panel DP. Since the adhesive member FR is disposed between the electronic component DC and the display panel DP, the bump DC-BP and the signal pad DP-PD may be blocked from external air. As a result, the bump DC-BP and the signal pad DP-PD may be prevented from being oxidized by the external air.

According to an embodiment of the present invention, a plurality of openings ONP overlapping the bump DC-BP are defined in the adhesive member FR. As illustrated in FIG. 7a, the openings ONP include first openings ONP-1 overlapping the first bump DC-BP1 and second openings ONP-2 overlapping the second bump DC-BP2. Each of the first openings ONP-1 and the second openings ONP-2 may have a shape arranged in the first direction DR1 at a predetermined interval. Hereinafter, in this specification, for convenience of description, the openings included in the adhesive member FR will be described as an "opening".

According to an embodiment of the present invention, a process of forming the adhesive member FR between the electronic component DC and the substrate SUB may be performed at the same time as the ultrasonography bonding process in which the electronic component DC and the signal pad DP-PD are in contact with each other. In detail, the adhesive member FR may have non-conductivity and be provided as a film-type adhesive resin including a thermal initiator. The adhesive member FR may change curing properties according to external heat.

For example, during a first period for which a temperature of the adhesive member FR increases from a first reference point to a second reference point through the external heat, viscosity characteristics of the conductive member RS may be lowered. That is, during the first period, the curing characteristics of the adhesive member FR may be deteriorated. Thereafter, during a second period for which a temperature of the adhesive member FR increases above the second reference point, the viscosity characteristics of the adhesive member FR may be improved. That is, the curing characteristics of the adhesive member FR may be improved during the second period.

Particularly, during the first period, the electronic component DC may be disposed on the chip area NDA-DC of the substrate SUB through an external pressure. When the external pressure is applied to a top surface DC-US of the electronic component DC, heat may be transferred to the adhesive member FR disposed between the electronic component DC and the substrate SUB. Also, during the first period, the bump DC-BP and the signal pad DP-PD may be in contact with each other, and the ultrasonography bonding process may be performed.

When the opening overlapping the bump is not defined in the adhesive member, the adhesive member may overlap between the bump and the signal pad. As the bump and the signal pad adhere to each other due to the external pressure, a portion of the adhesive member, which overlaps between the bump and the signal pad moves to the other space. In this case, as the adhesive member filled in the other space is expanded, the lifting may occur between the bump and the signal pad, or a residue of the adhesive member may remain between the bump and the signal pad. As a result, reliability of the electrical connection between the bump and the signal pad may be deteriorated.

According to an embodiment of the present invention, the opening ONP defined in the adhesive member FR may overlap the bump DC-BP. When the bump DC-BP and the signal pad DP-PD are in contact with each other due to the external pressure, the bump DC-BP may pass through the opening ONP to adhere to the signal pad DP-PD. That is, while the bump DC-BP and the signal pad DP-PD adhere to each other by the external pressure, the adhesive member FR may be prevented from being changed in shape. That is, due to ultrasonic vibration between the bump DC-BP and the signal pad DP-PD, a partial change in shape of the adhesive member FR may occur according to the process, but the change in shape of the adhesive member FR may be reduced generally.

Also, before the ultrasonography bonding between the bump DC-BP and the signal pad DP-PD, the adhesive member FR may be provided in a rectangular film type. According to the present invention, even after the ultrasonography bonding between the bump DC-BP and the signal pad DP-PD, the outermost portion of the adhesive member FR may have a square shape on the plane.

Thus, the lifting phenomenon between the bump DC-BP and the signal pad DP-PD may be prevented from occurring, and the residue of the adhesive member FR between the bump DC-BP and the signal pad DP-PD may be prevented from occurring. This will be described in detail later.

Hereinafter, the bump DC-BP of the electronic component DC illustrated in FIG. 6 will be described in more detail with reference to FIG. 7b.

The first bump DC-BP1 includes a first bump portion BP1a and a second bump portion BP1b. On the plane, the second bump portion BP1b may have a surface area less than that of the first bump portion BP1a to surround the first bump portion BP1a. For example, a planar area of the second bump part BP1b may range from 5% to 50% of a planar area of the first bump part BP1a. The first bump portion BP1a and the second bump portion BP1b may be provided in an integrated shape by the same process.

The second bump DC-BP2 includes a first bump portion BP2a and a second bump portion BP2b. On the plane, the second bump portion BP2b may have a surface area less than that of the first bump portion BP2a to surround the first bump portion BP2a. For example, a planar area of the second bump portion BP2b may range from 5% to 50% of a planar area of the first bump portion BP2a. The first bump portion BP2a and the second bump portion BP2b may be provided in an integrated shape by the same process.

According to an embodiment of the present invention, on the plane, the opening ONP may overlap the bump DC-BP on the whole. That is, a planar area of the opening ONP and a planar area of the bump DC-BP may be the same. Here, "the same" may mean as including an error range due to the ultrasonography bonding process between the bump DC-BP and the signal pad DP-PD.

In detail, before the ultrasonography bonding between the bump DC-BP and the signal pad DP-PD, the adhesive member FR is disposed between the bump DC-BP and the signal pad DP-PD. In this case, the electronic component DC and the substrate SUB may be aligned so that the opening ONP overlaps each of the bump DC-BP and the signal pad DP-PD on the whole. For the above-described alignment, the adhesive member FR may have transmittance of 30% to 80% in a wavelength region of visible light. That is, as the adhesive member FR according to the present invention has the transmittance, an alignment mark between the electronic component DC and the substrate SUB may be identified.

After the ultrasonography bonding between the bump DC-BP and the signal pad DP-PD, the adhesive member FR may have a structure surrounding side surfaces of the bump DC-BP and the signal pad DP-PD, and the bump DC-BP and the signal pad DP-PD, which face each other, may not be in contact with each other.

Figure 8A:
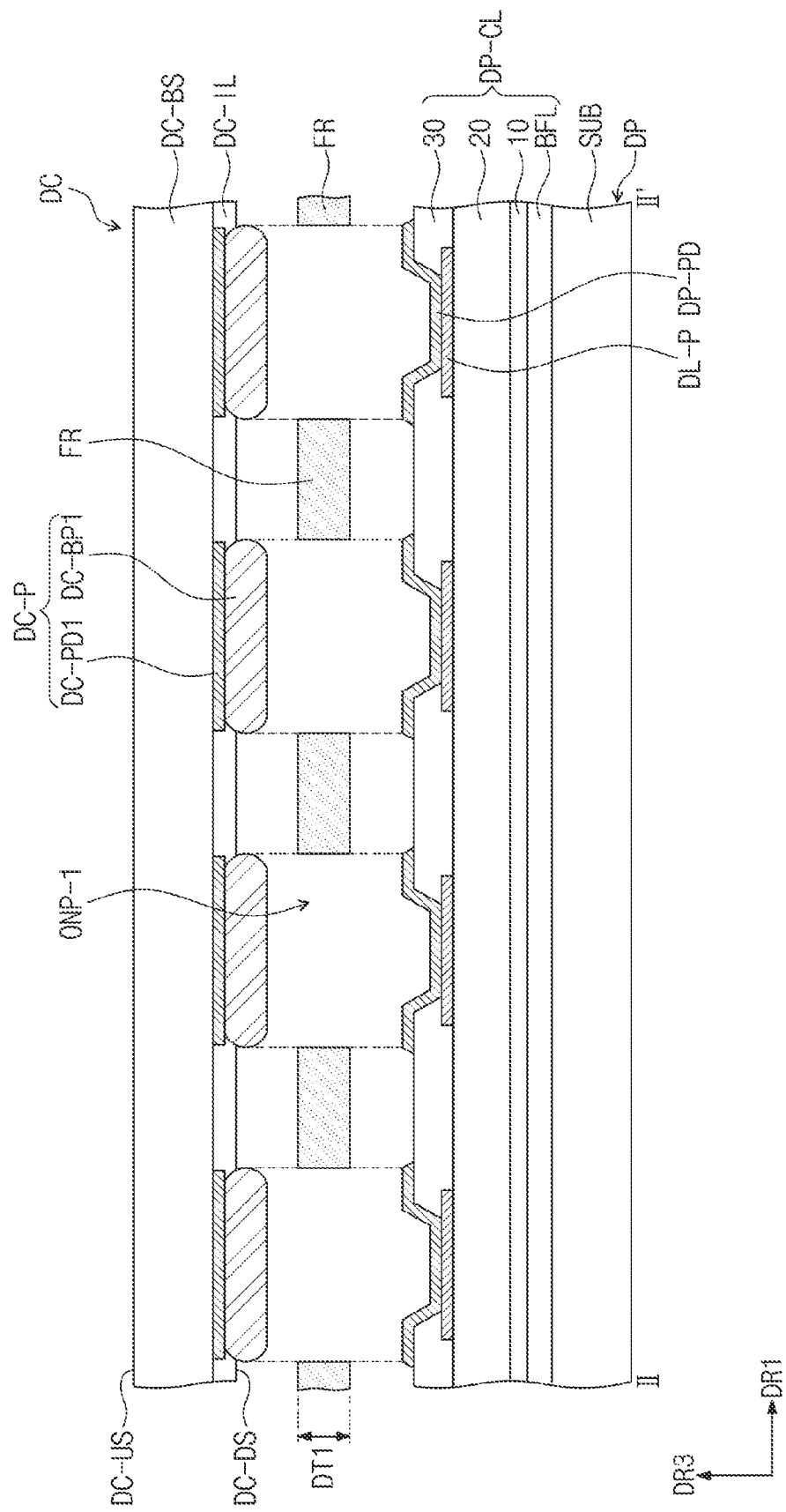
FIGS. 8a and 8b are cross-sectional views taken along line II-IF of FIG. 7 according to an embodiment of the present invention.

FIG. 8a is a cross-sectional view taken along line II-II' of FIG. 7 according to an embodiment of the present invention.

Figure 8B:
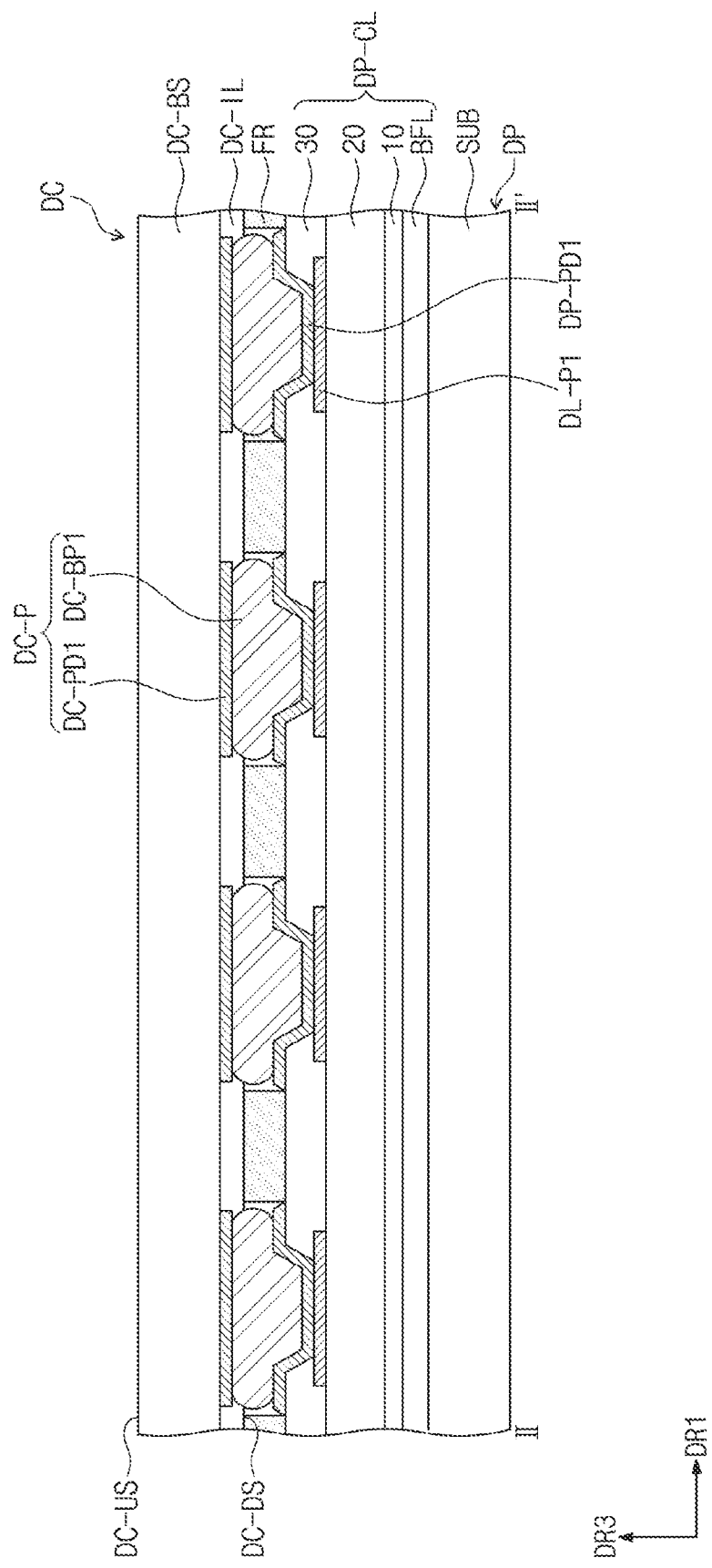

FIGS. 8a and 8b illustrate a structure for the ultrasonography bonding between the bump DC-BP of the electronic component DC and the signal pad DP-PD of the display panel DP. Particularly, in FIGS. 8a and 8b, a structure of the display device according to the ultrasonography bonding between the first bump DC-BP1 and the first signal pad DP-PD1 is illustrated as an example. Although not shown, the second bump DC-BP2 and the second signal pad DP-PD2 of the electronic component DC may also have the same structure as those illustrated in FIGS. 8a and 8b.

In detail, referring to FIG. 8a, the electronic component DC includes a base substrate DC-BS, a driving pad part DC-P, and a pad insulating layer DC-IL. The driving pad part DC-P includes a first driving pad DC-PD1 and a first bump DC-BP1.

A top surface of the base substrate DC-BS may correspond to the top surface DC-US of the electronic component DC. A bottom surface of the pad insulating layer DC-IL facing the display panel DP may correspond to the bottom surface DC-DS of the electronic component DC. For example, the base substrate DC-BS may include a silicon material.

The first driving pad DC-PD1 may be disposed on a bottom surface of the base substrate DC-BS. The first driving pad DC-PD1 may be electrically connected to a circuit element (not shown) of the electronic component DC. The pad insulating layer DC-IL may expose a portion of the first driving pad DC-PD1 and may be disposed on the bottom surface of the base substrate DC-BS. In this case, a through-hole through which a portion of the first driving pad DC-PD1 is exposed may be defined in the pad insulating layer DC-IL. The first bump DC-BP1 may be disposed directly on the first driving pad DC-PD1. According to an embodiment, the first driving pad DC-PD1 may be omitted.

The display panel DP may face the electronic component DC in the third direction DR3. Particularly, before the ultrasonography bonding between the bumps DC-BP and the signal pads DP-PD, the first bumps DC-BP1 may be spaced apart from the first signal pad DP-PD1 with a first opening ONP-1, which is defined in the adhesive member FR, therebetween. The first signal pad DP-PD1 may be electrically connected to the first pad part DL-P1 of the first data line DL1.

The adhesive member FR may have a first thickness DT1 and be disposed between the display panel DP and the electronic component DC. The number of first openings ONP-1 defined in the adhesive member FR may correspond to the number of first bumps DC-BP1.

Referring to FIG. 8b, the first bump DC-BP1 may pass through the first opening ONP-1 by the external heat and pressure applied to the top surface DC-US of the electronic component DC and then be in electrical contact with the first signal pad DP-PD1. When the ultrasonic vibration is applied to an interface between the bump DC-BP and the first signal pad DP-PD1, frictional heat is generated at the interface. Simultaneously, the interface between the first bump DC-BP1 and the first signal pad DP-PD1 may adhere (or be welded) to each other by the frictional heat due to the external heat and pressure applied to the top surface DC-US of the base substrate DC-BS.

Particularly, the first bump DC-BP1 may pass through the first opening ONP-1 illustrated in FIG. 8a and then be in contact with the first signal pad DP-PD1. Thus, during the ultrasonography bonding process between the first bump DC-BP and the first signal pad DP-PD1, a change in shape of the adhesive member FR may be reduced.

That is, as the change in shape of the adhesive member FR is prevented, the phenomenon in which the bump DC-BP of the electronic component DC is lifted from the signal pad DP-PD may be prevented from occurring. As a result, the overall reliability of the electrical connection between the electronic component DC and the display panel DP may be improved.

Figure 9B:
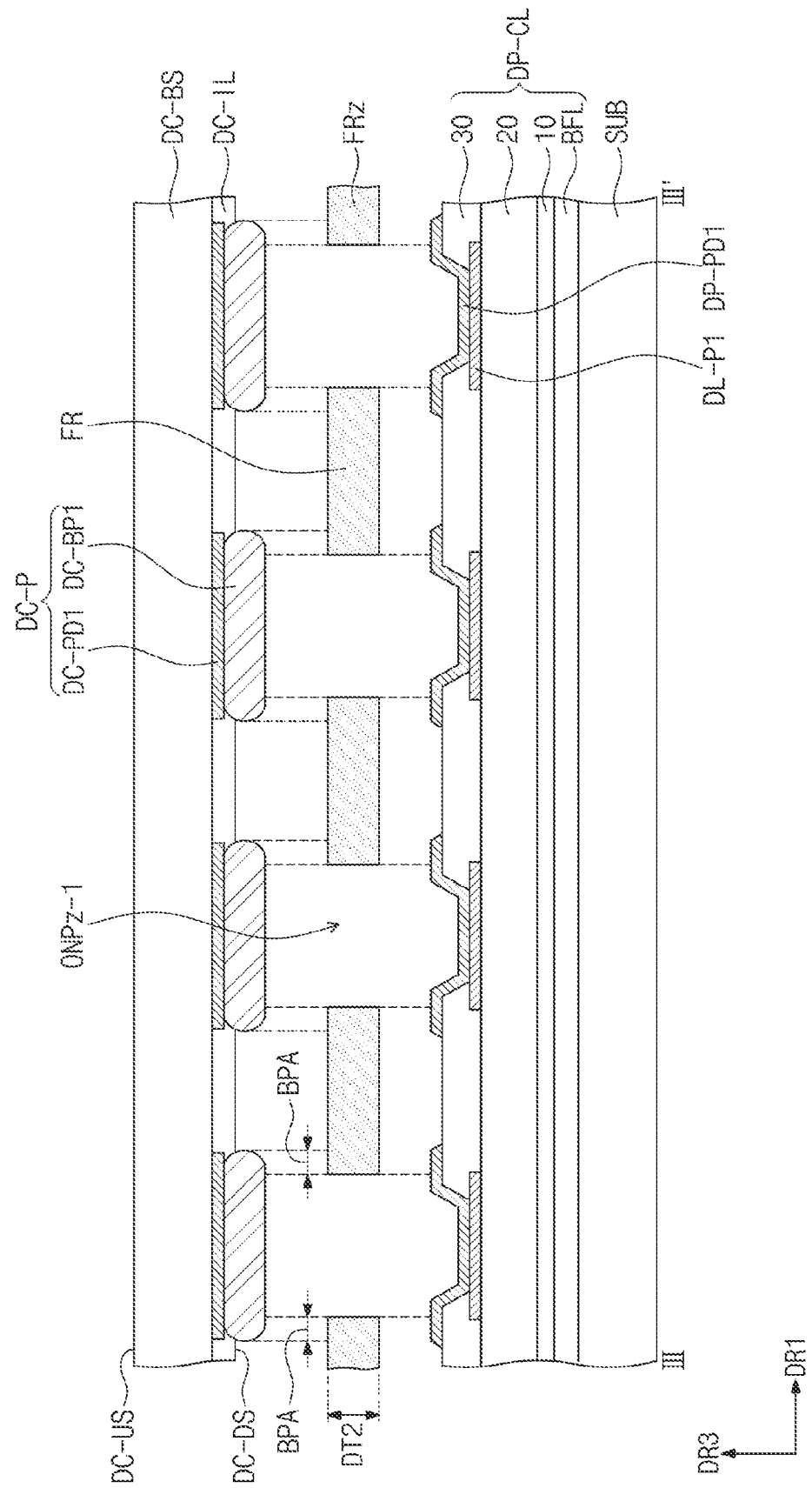

FIG. 9a is a plan view of an adhesive member according to another embodiment of the present invention. FIG. 9b is a cross-sectional view taken along line III-III' of FIG. 9a.

An adhesive member FRz illustrated in FIG. 9a may have a reduced planar area of an opening ONPz when compared to the adhesive member FR illustrated in FIG. 7a.

In detail, referring to FIG. 9a, a plurality of openings ONPz are defined in the adhesive member FRz. The plurality of openings ONPz include first openings ONPz-1 overlapping the first bump DC-BP1 and second openings ONPz-2 overlapping the second bump DC-BP2. Hereinafter, the first openings ONPz-1 and the second openings ONPz-2 will be described as a first opening and a second opening, respectively.

According to an embodiment of the present invention, a planar area of the first opening ONPz-1 may be less than a planar area of the first bump DC-BP1. The adhesive member FRz may at least partially overlap the second bump portion BP1b of the first bump DC-BP1 illustrated in FIG. 7b and may not overlap the first bump portion BP1a of the first bump DC-BP1. Particularly, on the plane, the adhesive member FRz may overlap a planar area of the second bump portion BP1b by 30% or more to 70% or less.

Likewise, a planar area of the second opening ONPz-2 may be less than a planar area of the second bump DC-BP2. The adhesive member FRz may overlap the second bump portion BP2b of the second bump DC-BP2 illustrated in FIG. 7B and may not overlap the first bump portion BP2a of the second bump DC-BP2. Particularly, on the plane, the adhesive member FRz may overlap a planar area of the second bump portion BP2b by 30% or more to 70% or less.

As described above, after ultrasonography bonding between the bump DC-BP and the signal pad DP-PD, a portion of the adhesive member FRz may overlap the bump DC-BP. That is, a residue of the adhesive member FRz may remain between the second bump portion BP1b and a first signal pad DP-PD1 or between the second bump portion BP2b and a second signal pad DP-PD2. However, the adhesive member FRz may be non-overlapping, that is, may not contact each of the first bump portions BP1a and BP2a.

Referring to FIG. 9b, the adhesive member FRz includes a filling area BPA overlapping the first bump DC-BP1. The filling area BPA at least partially overlaps the second bump portion BP1b of the first bump DC-BP1 illustrated in FIG. 7b.

According to the present invention, the adhesive member FRz may have a second thickness DT2. Particularly, the second thickness DT2 of the adhesive member FRz illustrated in FIG. 9b may be less than the first thickness DT1 of the adhesive member FR illustrated in FIG. 8b. Thus, the adhesive member FRz overlapping the filling area BPA may be pressed through the first bump DC-BP1 and the first signal pad DP-PD1 to move to the other space. That is, in consideration of expansion of a size of the adhesive member FRz overlapping the other space, the size of the adhesive member FRz may be formed.

Figure 10B:
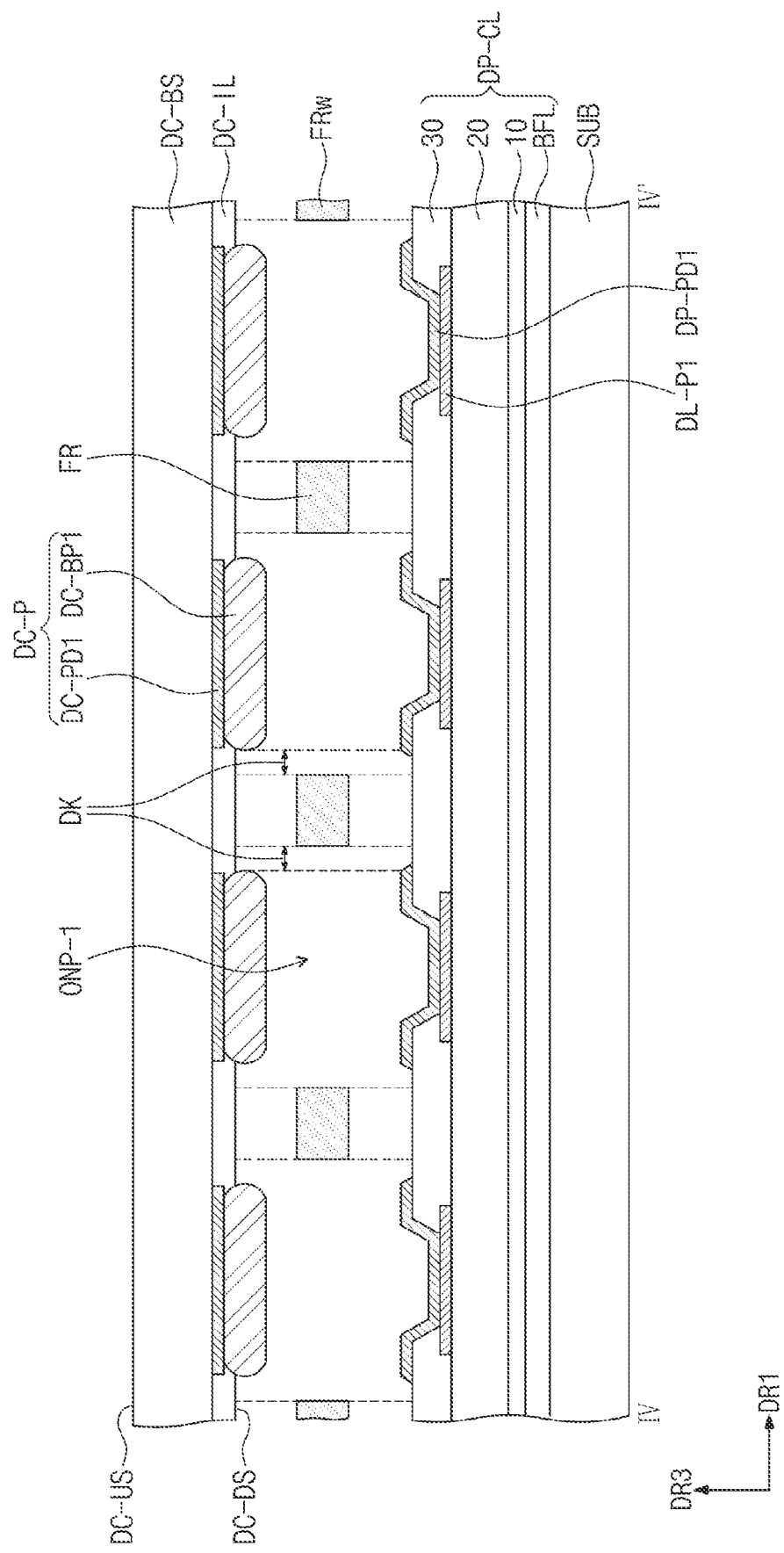
Figure 10C:
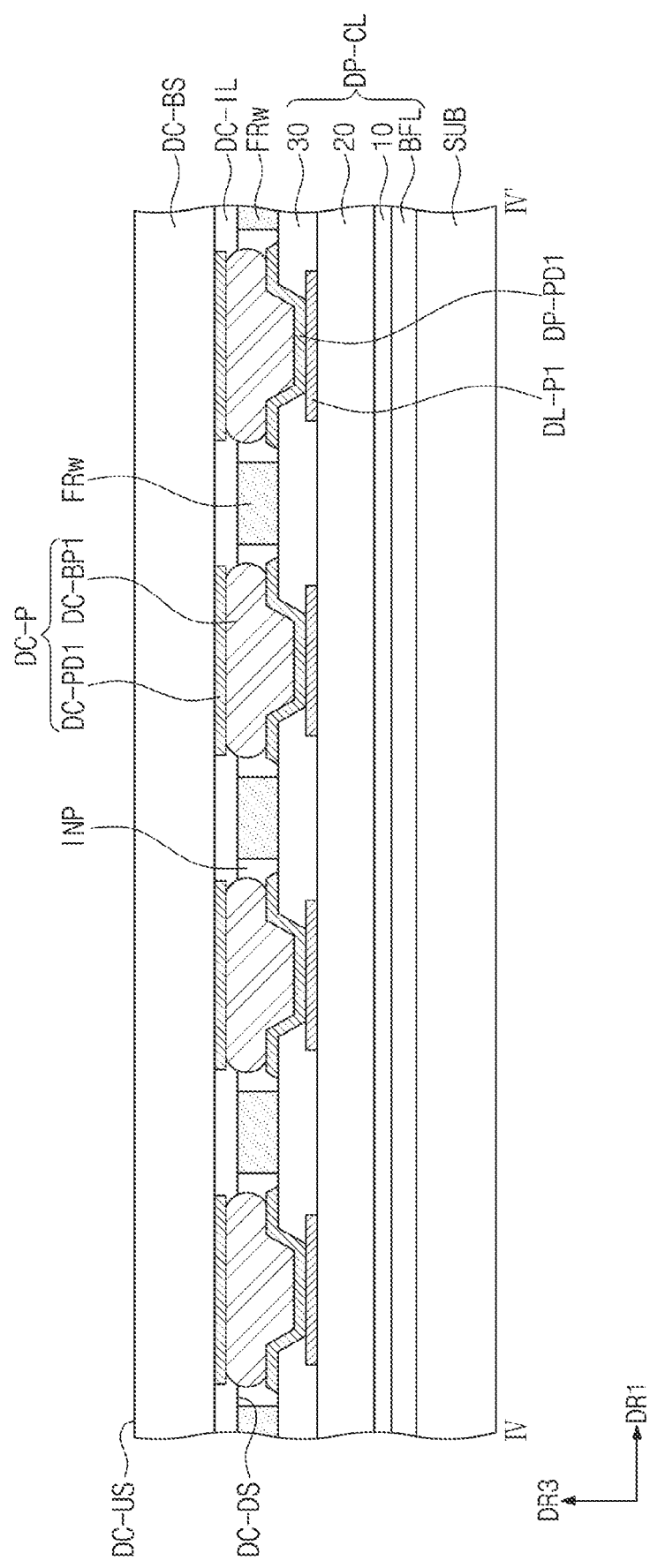

FIG. 10a is a plan view of an adhesive member according to another embodiment of the present invention. FIGS. 10b and 10c are cross-sectional views of the display device, taken along line IV-IV' of FIG. 10a.

The adhesive member FRw illustrated in FIG. 10a may have an enlarged planar area of the opening ONPz when compared to the adhesive member FR illustrated in FIG. 7a.

In detail, referring to FIG. 10a, a plurality of openings ONPw are defined in the adhesive member FRw. The plurality of openings ONPw include first openings ONPw-1 overlapping the first bump DC-BP1 and second openings ONPw-2 overlapping the second bump DC-BP2. Hereinafter, the first openings ONPw-1 and the second openings ONPw-2 will be described as a first opening and a second opening, respectively.

According to an embodiment of the present invention, a planar area of the first opening ONPw-1 may be greater than a planar area of the first bump DC-BP1. For example, the first opening ONPw-1 overlaps the first bump DC-BP1 on the whole. In addition, the first opening ONPw-1 may partially overlap between two first bumps DC-BP1 adjacent in the first direction DR1 and between a first bump DC-BP1 and a second bump DC-BP2, which are adjacent to each other in the second direction DR2.

A planar area of the second opening ONPw-2 may be greater than a planar area of the second bump DC-BP2. For example, the second opening ONPw-2 overlaps the second bump DC-BP2 on the whole. In addition, the second opening ONPw-2 may partially overlap between two second bumps DC-BP2 adjacent in the first direction DR1 and between a first bump DC-BP1 and a second bump DC-BP2, which are adjacent to each other in the second direction DR2.

Referring to FIG. 10b, on the plane, the adhesive member FRw may be spaced apart from the first bump DC-BP1. The adhesive member FRw is disposed between two first bumps DC-BP1 adjacent in the first direction DR1 and is spaced a predetermined distance DK from each of the two adjacent first bumps DC-BP1 on the plane.

Referring to FIG. 10c, after the ultrasonography bonding between the bump DC-BP and the signal pad DP-PD, the adhesive member FRw is spaced apart from the first bump DC-BP1 on the plane. As a result, an inner space INP may be defined by the first bump DC-BP1, the first signal pad DP-PD1, and the adhesive member FRw.

Figure 11A:
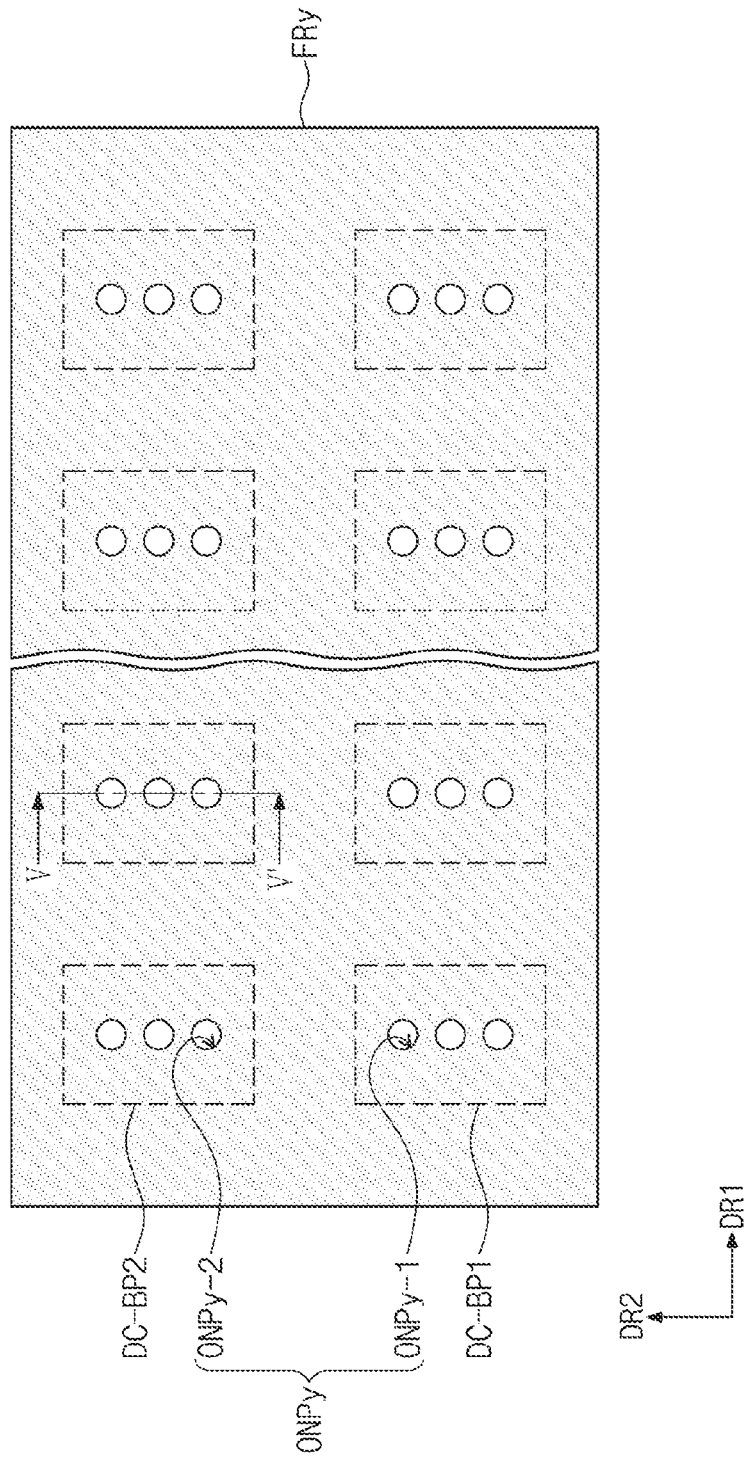
FIG. 11a is a plan view of an adhesive member according to another embodiment of the present invention.
Figure 11B:
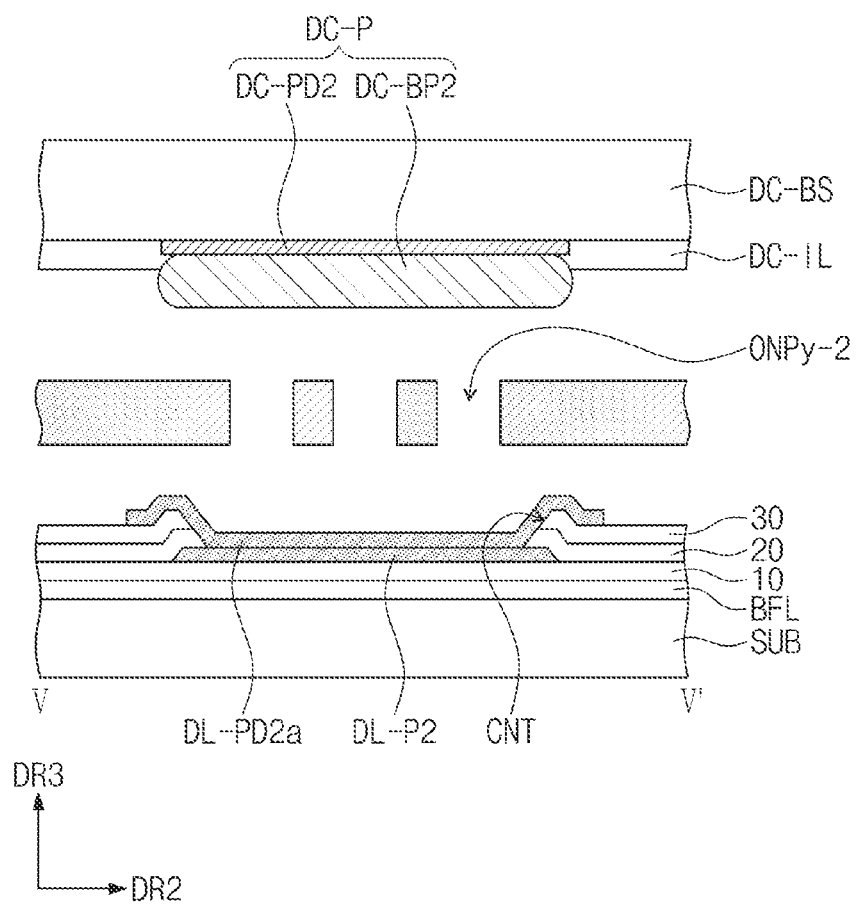

FIG. 11a is a plan view of an adhesive member according to another embodiment of the present invention. FIG. 11b is a cross-sectional view taken along line VIII-VIII' of FIG. 11a.

An adhesive member FRy illustrated in FIG. 11a may have openings ONPy that is changed in shape when compared to the adhesive member FR illustrated in FIG. 7a.

In detail, referring to FIGS. 11a and 11b, a plurality of openings ONPy are defined in the adhesive member FRy. The plurality of openings ONPy include first openings ONPy-1 overlapping the first bump DC-BP1 and second openings ONPy-2 overlapping the second bump DC-BP2.

According to an embodiment of the present invention, the first opening ONPy-1 includes a plurality of first sub-openings overlapping the first bump portion BP1a. The first sub-openings may be spaced apart from each other and be arranged at a predetermined interval in the second direction.

The second opening ONPy-2 includes a plurality of second sub-openings overlapping the first bump portion BP2a. The second sub-openings may be spaced apart from each other and be arranged at a predetermined interval in the second direction.

Particularly, as illustrated in FIG. 11a, although each of the first sub-openings and the second sub-openings have a circular shape on the plane, the shape of the sub-opening may not be limited thereto and thus may be changed into various shapes.

Figure 12:
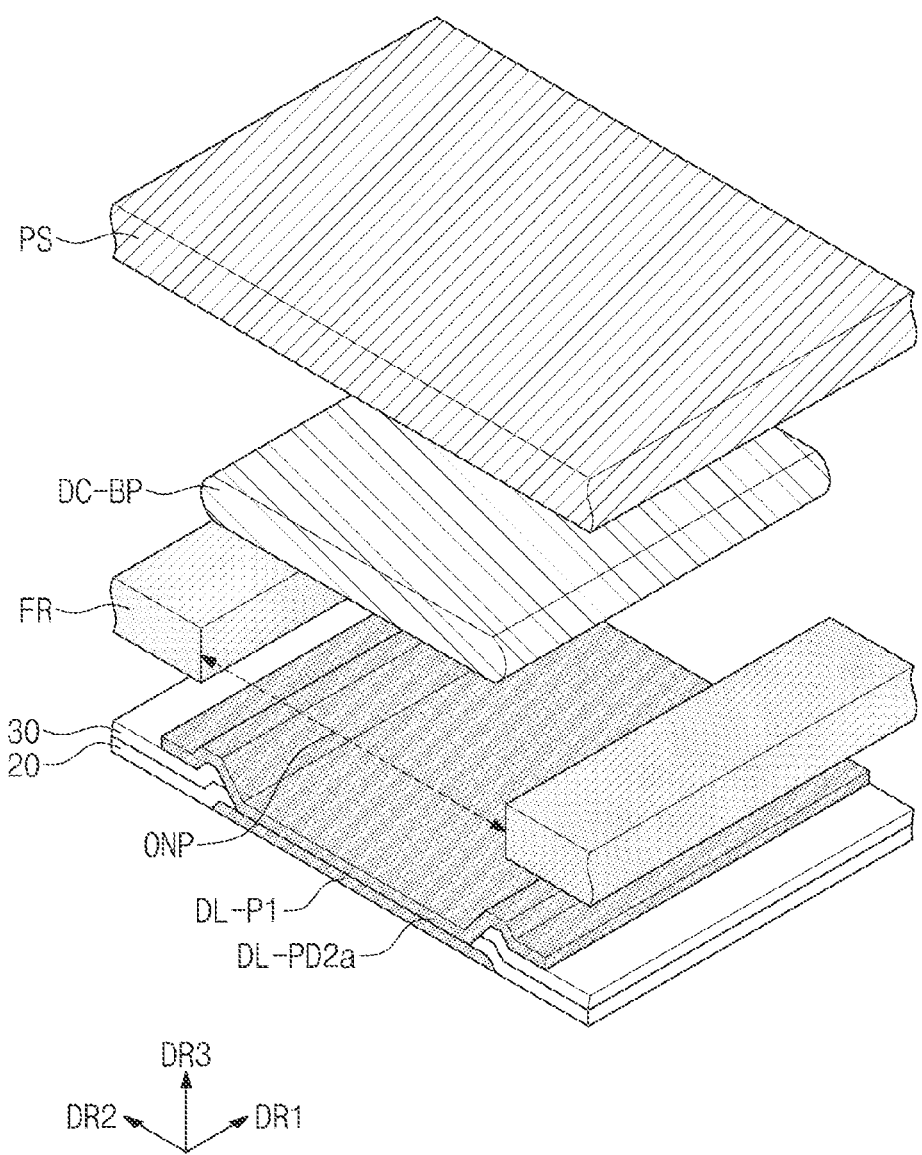
FIG. 12 is an exploded perspective view of a display device according to an embodiment of the present invention.
Figure 13:
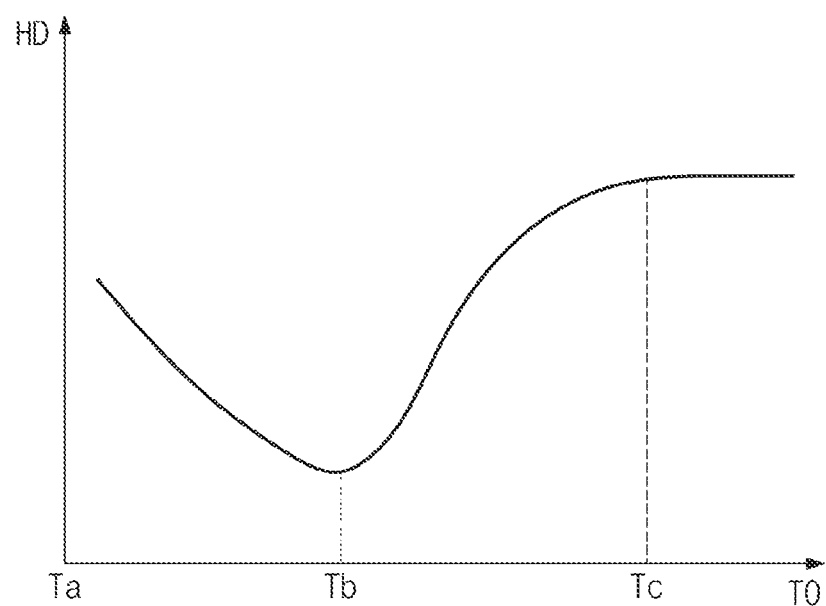
FIG. 13 is a graph illustrating characteristics of an adhesive member.
Figure 14:
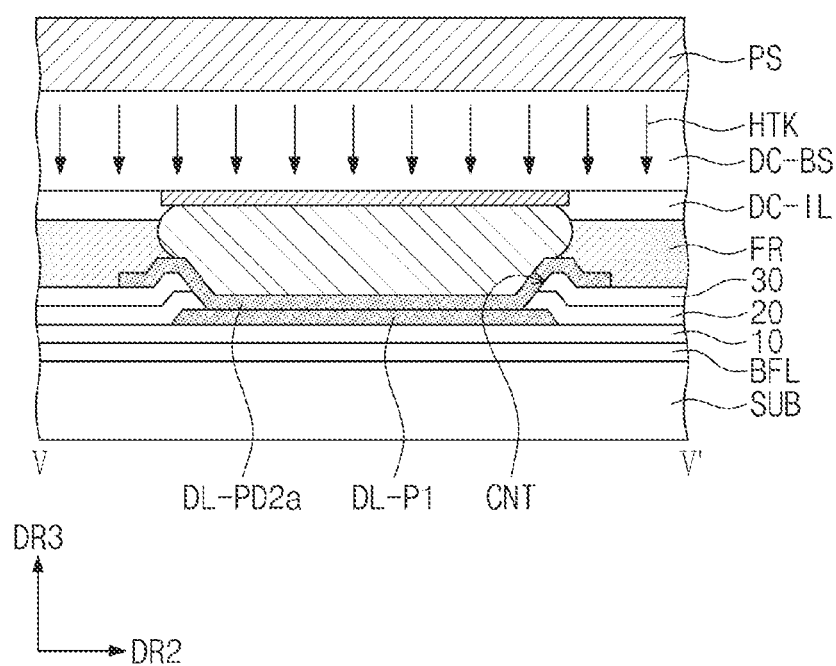
FIG. 14 is a cross-sectional view of a display device according to an embodiment of the present invention.

FIG. 12 is an exploded perspective view of a display device according to an embodiment of the present invention. FIG. 13 is a graph illustrating characteristics of an adhesive member. FIG. 14 is a cross-sectional view of a display device according to an embodiment of the present invention.

Hereinafter, the ultrasonography bonding process of bonding the bump DC-BP of the electronic component DC to the signal pad DP-PD of the display panel DP will be described in more detail with reference to FIGS. 12 to 14.

Referring to FIG. 12, a heat/pressure mechanism PS may be disposed on the electronic component DC to apply a pressure to the electronic component DC. Also, a heat/pressure mechanism PS may apply heat to an interface between the adhesive member FR, the bump DC-BP, and the signal pad DP-PD, which are disposed between the electronic component DC and the display panel DP. Particularly, curing properties of the adhesive member FR may be changed by the heat applied from the heat/pressure mechanism PS.

An opening ONP overlapping the bump DC-BP is defined in the adhesive member FR. According to the present invention, the bump DC-BP may overlap the opening ON by 70% or more on the plane.

Referring to FIG. 13, a horizontal direction of the graph represents a temperature TO, and a vertical direction of the graph represents viscosity characteristics HD of the adhesive member FR. The viscosity of the adhesive member FR may decrease during a first period for which the temperature of the adhesive member FR increases from a first reference point Ta to a second reference point Tb through external heat. For example, the temperature of the first reference point Ta to the second reference point Tb may be about 0 degrees or more and about 30 degrees or less.

Thereafter, during a second period for which a temperature of the adhesive member FR increases above the second reference point Tb, the viscosity of the adhesive member FR may be improved. That is, the curing characteristics of the adhesive member FR may be improved during the second period. Also, when the temperature of the adhesive member FR increases above a third reference point Tc, the viscosity of the adhesive member FR may not be substantially changed. That is, the curing characteristics of the adhesive member FR may be the highest by using the third reference point Tc as a reference point. For example, the temperature of the second reference point Tb to the third reference point Tc may be about 30 degrees or more and about 190 degrees or less.

Referring to FIGS. 12 and 14, as the heat/pressure mechanism TS may press the top surface DC-US of the electronic component DC, the bump DC-BP of the electronic component DC may pass through the opening ONP to adhere to the signal pad DP-PD. Simultaneously, the heat/pressure mechanism TS may apply heat to the interface between the adhesive member FR, the bump DC-BP, and the signal pad DP-PD.

Thereafter, ultrasonic vibration may occur at the interface between the bump DC-BP and the signal pad DP-PD. As a result, the bottom surface of the bump DC-BP and the top surface of the signal pad DP-PD may be welded to each other due to friction.

As described above, the embodiment is disclosed in the drawings and the specification. While specific terms were used, they were not used to limit the meaning or the scope of the present invention described in claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying claims.

The technology for bonding the electronic component to the display panel using the ultrasonography bonding may improve the connection reliability between the electronic component and the display panel. Therefore, the present invention for bonding the electronic component to the display panel through the ultrasonography bonding has high industrial applicability.

The invention claimed is:

1. A display device, comprising:
an electronic component comprising a bump,
wherein the bump comprises a first bump portion and a second bump portion, and the second bump portion has a surface area less than that of the first bump portion on a plane and surrounds the first bump portion;
a display panel facing the electronic component and comprising a signal pad that is in contact with the bump; and
an adhesive member disposed between the display panel and the electronic component and comprising an opening overlapping the first bump portion on the plane,
wherein the bump is in contact with the signal pad through the opening.

2. The display device of claim 1, wherein a planar area of the second bump portion is less than a planar area of the first bump portion by about 5% or more and about 50% or less.

3. The display device of claim 2, wherein the adhesive member is not in contact with the first bump portion.

4. The display device of claim 1, wherein, on the plane, the opening fully overlaps the bump.

5. The display device of claim 4, wherein the adhesive member is not in contact with the signal pad and the bump, which face each other.

6. The display device of claim 4, wherein the adhesive member is spaced apart from the second bump portion on the plane.

7. The display device of claim 6, wherein an inner space is defined by the bump, the signal pad, and the adhesive member.

8. The display device of claim 1, wherein, on the plane, the adhesive member at least partially overlaps the signal pad and the second bump portion.

9. The display device of claim 8, wherein the adhesive member is not in contact with the first bump portion.

10. The display device of claim 9, wherein, on the plane, the adhesive member overlaps a planar area of the second bump portion by about 30% or more to about 70% or less.

11. The display device of claim 1, wherein, on the plane, an outermost portion of the adhesive member has a rectangular shape.

12. The display device of claim 1, wherein the adhesive member has a transmittance of about 30% to about 80% in a wavelength region of visible light.

13. The display device of claim 1, wherein the opening comprises a plurality of sub-openings spaced apart from each other on the plane and arranged in one direction.

14. The display device of claim 1, wherein the adhesive member has non-conductivity and comprises a thermal initiator.

15. The display device of claim 1, wherein the signal pad is one of a plurality of signal pads arranged in a first direction,
the bump is one of a plurality of bumps arranged in the first direction, and the bumps are in contact with the signal pads, respectively, and
on the plane, the adhesive member does not overlap the signal pads and the bumps.

16. A method for manufacturing a display device, the method comprising:
disposing an adhesive member, in which opening is defined, between a display panel and an electronic component,
wherein the display panel comprises a signal pad, and the electronic component comprises a bump;
aligning the signal pad and the bump such that the signal pad and the bump face each other with the opening disposed therebetween;
applying heat and pressure to the electronic component such that the bump passing through the opening is in contact with the signal pad; and
applying ultrasonic vibration to an interface between the bump and the signal pad.

17. The method of claim 16, wherein, on a plane, the bump overlaps the opening by about 70% or more.

18. The method of claim 16, wherein the bump fully overlaps the opening, and
an inner space is defined by the bump, the signal pad, and the adhesive member.

19. The method of claim 16, wherein a planar area of the adhesive member disposed between the display panel and the electronic component is less than a planar area of the bump.

20. An adhesive member, comprising:
a thermal initiator; and
a plurality of openings arranged at a predetermined interval in a first direction and respectively overlapping bumps of an electronic component on a plane,
wherein the adhesive member is disposed between the electronic component and a display panel and connects the electronic component and the display panel, and
the adhesive member is not conductive.

* * * * *